US011605729B2

(12) United States Patent
Hall et al.

(10) Patent No.: US 11,605,729 B2
(45) Date of Patent: Mar. 14, 2023

(54) METHOD OF MAKING NANOSHEET LOCAL CAPACITORS AND NVM DEVICES

(71) Applicant: NXP B.V., Eindhoven (NL)

(72) Inventors: Mark Douglas Hall, Austin, TX (US); Tushar Praful Merchant, Austin, TX (US); Anirban Roy, Austin, TX (US)

(73) Assignee: NXP B.V., Eindhoven (NL)

( * ) Notice: Subject to any disclaimer, the term of this patent is extended or adjusted under 35 U.S.C. 154(b) by 120 days.

(21) Appl. No.: 17/188,868

(22) Filed: Mar. 1, 2021

(65) Prior Publication Data

US 2022/0278226 A1 Sep. 1, 2022

(51) Int. Cl.

*H01L 29/66* (2006.01)
*H01L 29/788* (2006.01)
*H01L 29/786* (2006.01)
*H01L 29/423* (2006.01)
*H01L 29/40* (2006.01)
*H01L 27/11521* (2017.01)

(52) U.S. Cl.

CPC ...... *H01L 29/66825* (2013.01); *H01L 29/401* (2013.01); *H01L 29/42324* (2013.01); *H01L 29/42392* (2013.01); *H01L 29/66545* (2013.01); *H01L 29/66742* (2013.01); *H01L 29/7881* (2013.01); *H01L 29/78696* (2013.01); *H01L 27/11521* (2013.01)

(58) Field of Classification Search

CPC ............. H01L 29/66825; H01L 29/401; H01L 29/42324; H01L 29/42392; H01L 29/66545; H01L 29/66742; H01L 29/78696; H01L 29/7881; H01L 27/11521

USPC .......................................................... 257/300

See application file for complete search history.

(56) References Cited

U.S. PATENT DOCUMENTS

| | | | |
|---|---|---|---|
| 10,141,403 B1 | 11/2018 | Cheng et al. | |
| 10,269,920 B2 | 4/2019 | Cheng et al. | |
| 10,283,516 B1 | 5/2019 | Reznicek et al. | |
| 10,615,288 B1 | 4/2020 | Kong et al. | |
| 10,700,083 B1 | 6/2020 | Ramkumar et al. | |
| 2018/0248021 A1 | 8/2018 | Bi et al. | |
| 2019/0130956 A1* | 5/2019 | Müller | H01L 27/1159 |
| 2020/0083382 A1 | 3/2020 | Xu et al. | |
| 2020/0168715 A1 | 5/2020 | Wu et al. | |
| 2022/0208769 A1* | 6/2022 | Chou | H01L 29/42392 |

OTHER PUBLICATIONS

A. Hubert et al., A stacked SONOS technology, up to 4 levels and 6nm crystalline nanowires, with gate-all-around or independent gates (Φ-Flash), suitable for full 3D integration, IEEE, 2009.

(Continued)

*Primary Examiner* — Tong-Ho Kim

(57) ABSTRACT

A semiconductor device and fabrication method are described for integrating a nanosheet transistor with a capacitor or nonvolatile memory cell in a single nanosheet process flow by forming a nanosheet transistor stack (11-18) of alternating Si and SiGe layers which are selectively processed to form epitaxial source/drain regions (25A, 25B) and to form gate electrodes (33A-D) which replace the silicon germanium layers in the nanosheet transistor stack, and then selectively forming one or more insulated conductive electrode layers (e.g., 37/39, 25/55, 64/69) adjacent to the nanosheet transistor to define a capacitor or nonvolatile memory cell that is integrated with the nanosheet transistor.

18 Claims, 14 Drawing Sheets

(56) References Cited

OTHER PUBLICATIONS

Wikipedia, Accelerometer, downloaded from the Internet Dec. 23, 2020.
Southwest Center for Microsystems Education (SCME), Microcantilever Applications Overview, Primary Knowledge, Participant Guide, Feb. 2017.
Emilie Bernard et al., First Internal Spacers' Introduction in Record High ION/IOFF TiN/HfO2 Gate Multichannel MOSFET Satisfying Both High-Performance and Low Standby Power Requirements, IEEE Electron Device Letters, vol. 30, No. 2, Feb. 2009.
Semiconductor Engineering, Gate-All-Around FET (GAA FET), Nov. 12, 2019 https://semiengineering.com/knowledge_centers/integrated-circuit/transistors/3d/gate-all-around-fet/.
Peide Ye et al., The Nanosheet Transistor Is the Next (and Maybe Last) Step in Moore's Law, Nanosheet devices are scheduled for the 3-nanometer node as soon as 2021, IEEE Spectrum, Jul. 30, 2019.
Mark Lapedus, Semiconductor Engineering, What's After FinFETs?, Jul. 24, 2017.
Jaclyn K. Sprenger et al., Electron-enhanced atomic layer deposition of silicon thin films at room temperature, J. Vac. Sci. Technol. A, vol. 36, No. 1, Jan./Feb. 2018.

* cited by examiner

ACTIVE PHOTO/
ETCH AND SiGe
ACCESS 26

METHOD OF MAKING NANOSHEET LOCAL CAPACITORS AND NVM DEVICES

BACKGROUND OF THE INVENTION

Field of the Invention

The present invention is directed in general to the field of semiconductor devices. In one aspect, the present invention relates to integrated nanosheet field effect transistors (FET) devices with local capacitors and/or nonvolatile memory devices and methods of fabricating same in a nanosheet process flow.

Description of the Related Art

As semiconductor device sizes are scaled down, the requirements for device design and fabrication continue to be tightened in order to fit more circuitry on smaller chips. As device sizes shrink, increasingly complex process integrations are used to define semiconductor device features and structures. For example, finFET transistors replaced planar FET transistors as the leading edge transistor architecture for 1×nm nodes, but with next-generation technologies, stacked nanosheet transistors are in line to replace finFETs as the leading edge transistor architecture starting at the 3 nm node. However, the existing solutions for fabricating nanosheet transistors are not well suited at a practical level for integrating nanosheet field effect transistor (FET) devices and other circuit elements, such as capacitors or non-volatile memory (NVM) cells, by virtue of the challenges with fabricating leading edge nanosheet transistors and additional circuit elements while meeting the performance requirements and cost constraints. Further limitations and disadvantages of conventional processes and technologies will become apparent to one of skill in the art after reviewing the remainder of the present application with reference to the drawings and detailed description which follow.

As seen from the foregoing, the existing solutions for integrating the fabrication of nanosheet field effect transistor (FET) devices and highly localized capacitors or NVM devices are extremely difficult at a practical level by virtue of the challenges with fabricating leading edge nanosheet transistors and highly localized capacitors or NVM devices while meeting the performance requirements and cost constraints. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
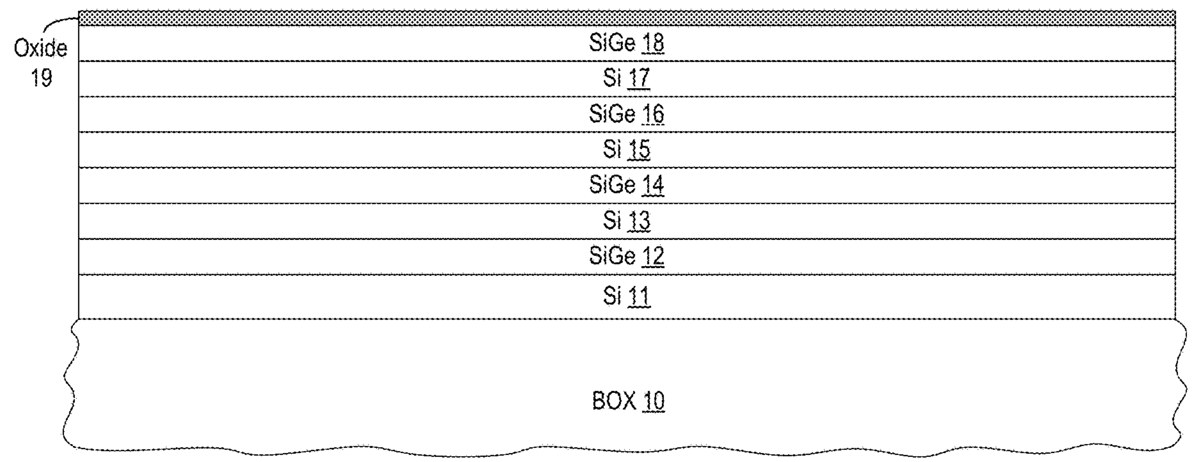
FIG. 1 is a partial cross-sectional view of a semiconductor structure including a Si/SiGe superlattice with an oxide cover layer formed over substrate in accordance with selected embodiments of the present disclosure.

A semiconductor device and fabrication method are described for integrating the fabrication of nanosheet transistors with capacitors and/or non-volatile memory (NVM) devices in a single nanosheet process flow, thereby providing a straightforward method for integrating capacitors and/or NVM devices with advanced nanosheet transistors on the same die with additional capacitor and/or NVM processing steps that are designed to have minimal effect on the nanosheet transistors. While specific implementation details are described herein with reference to one or more example embodiments, the present disclosure is directed to fabricating capacitors and/or NVM devices while the nanosheet transistors are being fabricated to make dual use of many process steps. The steps used for fabricating the capacitors and/or NVM devices are standard process steps used for fabricating the nanosheet transistors, so no new fab tools may be needed. As an initial set of fabrication steps, nanosheet transistors may be obtained by patterning and etching an initial Si/SiGe superlattice substrate structure to form separate transistor stacks which are processed using nanosheet process steps to form ALD metal gates in the transistor stacks. In selected embodiments, SiGe layers in the transistor stacks are selectively removed with a sequence of SiGe etch steps which are applied to the transistor stack. In the SiGe etch openings of the transistor stack, ALD oxide and metal layers are sequentially deposited to form transistor gate electrodes. In selected embodiments, local storage capacitors or NVM devices are formed on the top of the transistor stack by depositing, patterning and etching first and second polysilicon layers separated from one another and the transistor stack by one or more dielectric layers, thereby forming first and second capacitor plates on the top of the transistor stack. In other embodiments, local storage capacitors are formed on the sides of the transistor stack by sequentially depositing a first dielectric layer and first polysilicon layer over the top and sides of the transistor stack, and then performing one or more planarizing etches and/or polish steps to remove the first polysilicon layer from the top of the transistor stack and to form sidewall capacitor electrodes adjacent to the transistor stack which are capacitively coupled to the source/drain regions through the first dielectric layer. In other embodiments, local NVM devices are formed on the sides of the transistor stack by sequentially depositing a first dielectric layer and first polysilicon layer over the top and sides of the transistor stack, selectively etching the first polysilicon layer to clear the top of the transistor stack and to form first floating gate electrodes on the sides of the transistor stack, sequentially depositing a second dielectric layer and second polysilicon layer over the top and sides of the transistor stack, and then performing one or more planarizing etches and/or polish steps to remove the second polysilicon layer from the top of the transistor stack and to form sidewall control gate electrodes adjacent to the transistor stack which are capacitively coupled to the first floating gate electrodes through the second dielectric layer.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention. Further, reference numerals have been repeated among the drawings to represent corresponding or analogous elements. In addition, the depicted device layers that are shown as being deposited and/or etched are represented with simplified line drawings, though it will be appreciated that, in reality, the actual contours or dimensions of device layers will be non-linear, such as when the described etch processes are applied at different rates to different materials, or when the described deposition or growth processes generate layers based on the underlaying materials.

Various illustrative embodiments of the present invention will now be described in detail with reference to FIGS. 1-26. It is noted that, throughout this detailed description, certain layers of materials will be deposited and removed to form the semiconductor structure. Where the specific procedures for processing such layers or thicknesses of such layers are not detailed below, conventional techniques to one skilled in the art for depositing, removing or otherwise forming such layers at appropriate thicknesses shall be intended. Such details are well known and not considered necessary to teach one skilled in the art how to make or use the present invention.

One of the challenges with nanosheet transistors is that they can suffer from a lack of local charge (or energy) storage because of their very high switching speeds (>1 GHz). A sufficient amount of charge must be stored locally to drive the fast switching edge rates since storing charge too far away will suffer from IR (voltage) drop and will be unable to support the necessary high frequencies. While capacitors can be used to help supplement the charge that reaches the nanosheet transistors, existing semiconductor processes for fabricating nanosheet transistors do not enable the formation of highly localized capacitors immediately adjacent to the switching transistors because they are not well suited at a practical level for integrating the nanosheet field effect transistor (FET) devices and other circuit elements, such as capacitors or NVM cells. In addition, existing semiconductor processes for fabricating nanosheet transistors do not enable the formation of NVM cells in the open spaces immediately adjacent to the nanosheet transistor stacks. The additional processing steps for the capacitors or NVM devices can require new or special fabrication tools that are not required for the nanosheet transistor fabrication, further adding to the fabrication costs. In addition, the use of separate die for the nanosheet transistors and capacitors/NVM devices can increase the overall size of the integrated circuit devices, require additional wiring and connection costs, and reduce reliability of the more complex integrated circuit devices.

Turning now to FIG. 1, a partial cross-sectional view illustrates a semiconductor structure including a Si/SiGe superlattice 11-18 which is formed over a buried oxide (BOX) or dielectric layer 10 and covered by an oxide layer 19 in accordance with selected embodiments of the present disclosure. Depending on the requirements for protecting the transistor stack 11-19 against subsequent oxide etch steps, an additional protective nitride layer (not shown) may also be formed on the protective oxide layer 19. Though not shown, it will be appreciated that the semiconductor structure 10-19 is formed over an underlying substrate which may be implemented as a bulk silicon substrate, monocrystalline silicon (doped or undoped), or any semiconductor material including, for example, Si, SiC, SiGe, SiGeC, Ge, GaAs, InAs, InP as well as other Group III-V compound semiconductors or any combination thereof, and may be formed as the bulk handling wafer.

As will be appreciated, any suitable sequence of processing steps may be used to form the Si/SiGe superlattice 11-18 on the base structure BOX layer 10 and Si layer 11, such as by epitaxially growing a plurality of nanosheet semiconductor layers of alternating silicon (Si) and silicon germanium (SiGe). As shown, the depicted Si/SiGe superlattice 11-18 is a stack of alternating layers which includes a first group of layers 11, 13, 15, 17 that include silicon and a second group of layers 12, 14, 16, 18 that include silicon germanium. While the Si/SiGe superlattice 11-18 is shown with four silicon nanosheets 11, 13, 15, 17, it will be appreciated that the number of silicon nanosheets may be decreased or increased (e.g., 5 Si nanosheets instead of 4 Si nanosheets) to optimize transistor performance. If desired, the individual layers of the Si/SiGe superlattice 11-18 may be doped or implanted with impurities to control the conductivity of the Si/SiGe superlattice 11-18.

The terms "epitaxial growth, "epitaxial deposition" and "epitaxial formation" all refer generally to a semiconductor process for growing a semiconductor material or layer having a (substantially) crystalline structure on a deposition surface of seed semiconductor material or layer having a (substantially) crystalline structure such that the semiconductor material/layer being grown has substantially the same crystalline characteristics as the seed semiconductor material/layer. In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

After forming the Si/SiGe superlattice 11-18, a first insulator or dielectric layer 19 is formed, such as by depositing or otherwise forming a protective oxide layer 19 over the semiconductor substrate using chemical vapor deposition (CVD), plasma-enhanced chemical vapor deposition (PECVD), physical vapor deposition (PVD), atomic layer deposition (ALD), thermal oxidation, or any combination(s) of the above to a thickness of approximately 20-200 Angstroms, though a thinner or thicker oxide layer may also be used. Though not shown, an additional insulator or dielectric may be formed on the protective oxide layer 19, such as by depositing or otherwise forming a protective nitride layer to a predetermined thickness. As will be appreciated, the unetched Si/SiGe superlattice 11-18 and cover layer 19 are formed to cover the entire top surface of the buried oxide layer 10, including the intended nanosheet transistor areas.

Figure 2:
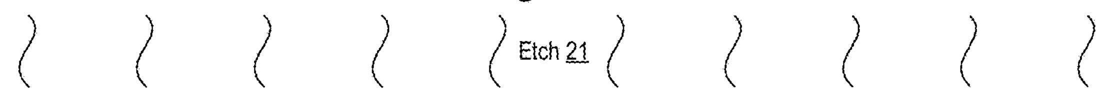
FIG. 2 illustrates processing subsequent to FIG. 1 after the Si/SiGe superlattice and oxide cover layer are patterned and etched to form a transistor stack.
Figure 2:
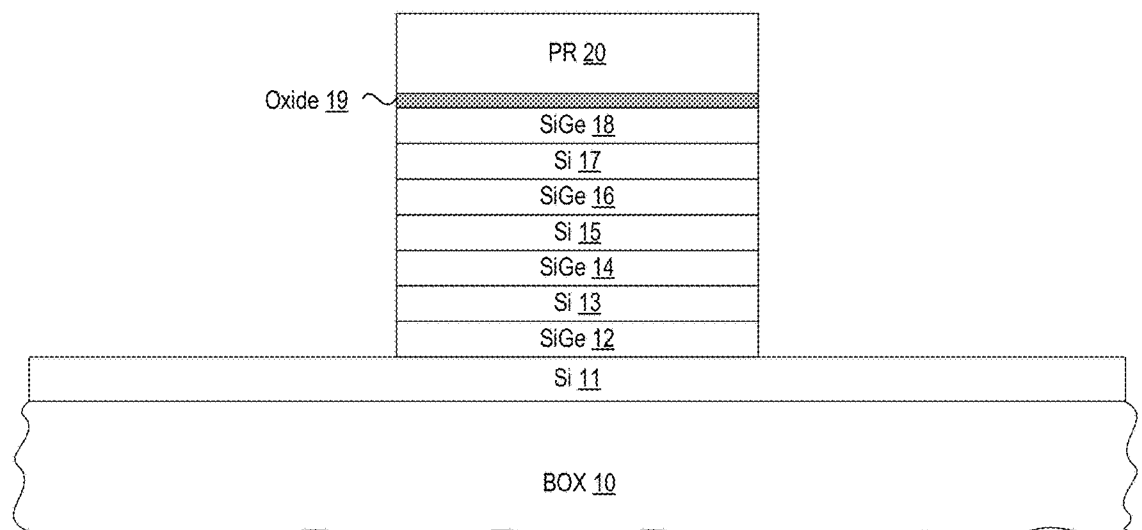

FIG. 2 illustrates processing of the semiconductor structure subsequent to FIG. 1 after the Si/SiGe superlattice is patterned and etched to form a transistor stack. While any suitable pattern and etch process may be used, a first patterned mask 20 may be formed over the Si/SiGe superlattice 11-18 and oxide layer 19 by depositing, patterning, etching or developing a photoresist or hard mask layer on the oxide layer 19. With the patterned photoresist mask 20 in place, one or more etch processes 21 are applied to create a transistor stack 12-19. The etch processing can include using the patterned photoresist mask 20 to perform a sequence of reactive-ion etching (RIE) steps having suitable etch chemistry properties to remove, in sequence, the exposed portions of the protective oxide layer 19, and underlying layers of the Si/SiGe superlattice 12-18. As will be appreciated, the sidewalls of the transistor stack 12-19 are substantially vertical, though minor deviations in the sidewall profile may occur at each layer due to etch processing variations.

Figure 3:
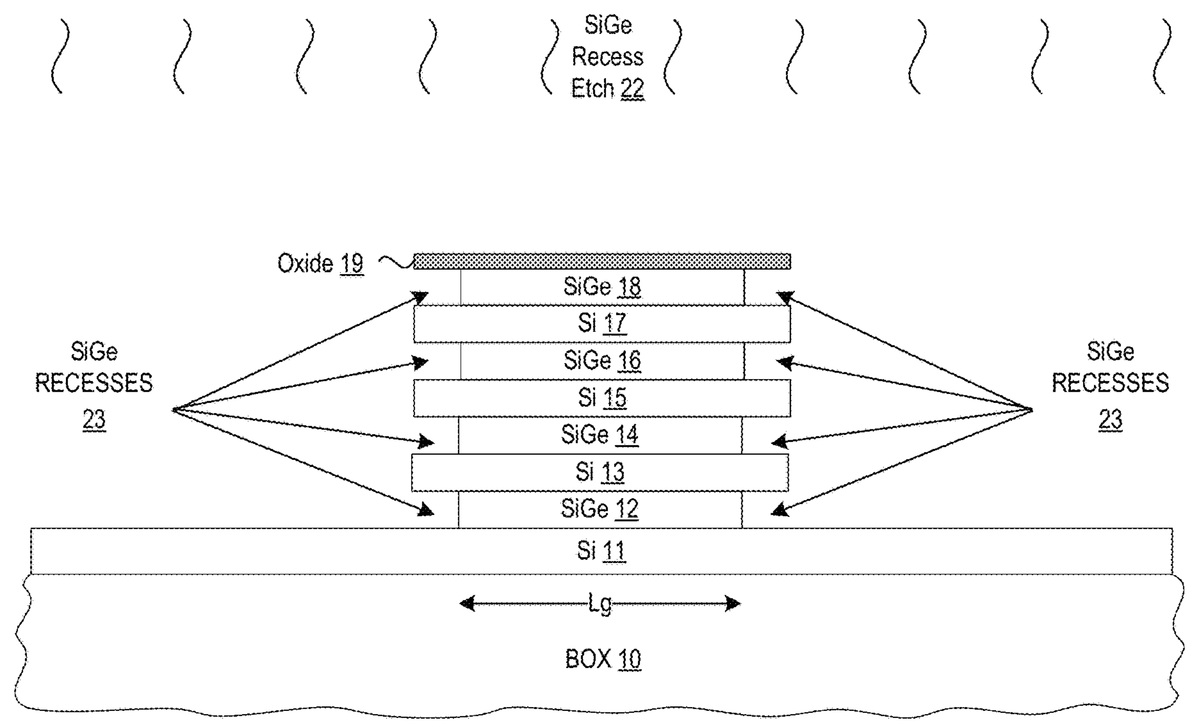
FIG. 3 illustrates processing subsequent to FIG. 2 after selectively recessing SiGe layers to form recess openings on the exposed sides of the transistor stack.

FIG. 3 illustrates processing of the semiconductor structure subsequent to FIG. 2 after selectively recessing SiGe layers to form recess openings 23 on the exposed sides of the transistor stack. At the depicted processing stage, the patterned mask 20 has been removed using any suitable stripping process and a selective SiGe recess etch 22 is applied to selectively and isotropically recess the SiGe layers on the exposed sides of the transistor stack 12-19. While any suitable SiGe etch process may be used, a controlled SiGe recess etch process 22, such as a timed isotropic dry etch, may be used to remove a portion of each SiGe layer from the exposed sides of the transistor stack 12-19. At the conclusion of the etching process, the remnant SiGe portions 12, 14, 16, 18 of the transistor stack remain where the recess openings 23 have not been formed, and will define a first gate length dimension Lg for the subsequently formed nanosheet transistor. As will be appreciated, the etched sidewall edges of the remnant SiGe portions 12, 14, 16, 18 may have a substantially vertical or slightly curved profile resulting from the selective SiGe recess etch 22.

Figure 4:
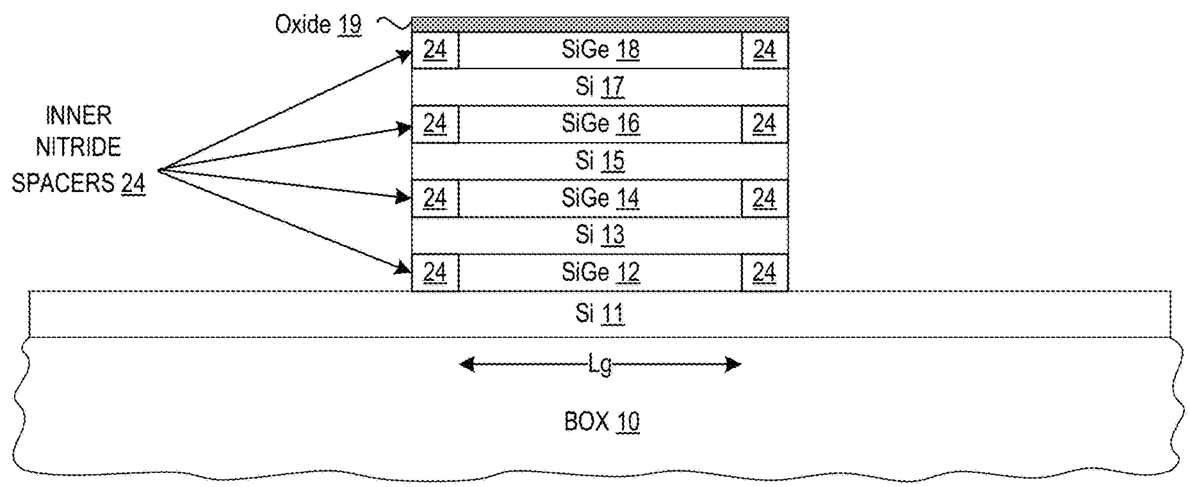
FIG. 4 illustrates processing subsequent to FIG. 3 after forming inner spacers to fill recess openings on the exposed sides of the transistor stack.

FIG. 4 illustrates processing of the semiconductor structure subsequent to FIG. 3 after forming inner spacers 24 to fill recess openings on the exposed sides of the transistor stack. While any suitable spacer formation sequence may be used, the inner spacers 24 may be formed by depositing one or more dielectric layers, such as an oxide and/or nitride layer, over the semiconductor structure (not shown) that are subsequently etched to remove the dielectric layer(s) from the top and sides of the transistor stack but leaving remnant dielectric spacers 24 in the recess openings at the exposed sides of the transistor stack 12-19. For example, an inner nitride layer may be deposited over the semiconductor structure to a predetermined thickness that is sufficient to cover at least the transistor stack 12-19 and fill the recess openings 23 on the exposed sides thereof. By applying an isotropic nitride etch process (e.g., RIE) to remove the inner nitride layer from the top and sides of the transistor stack 12-19, the remnant inner nitride layers form sidewall spacers 24 on the transistor stack. As will be appreciated, the etched sidewall edges of the remnant nitride spacers 24 may have a substantially vertical or slightly curved profile resulting from the applied isotropic nitride etch process.

Figure 5:
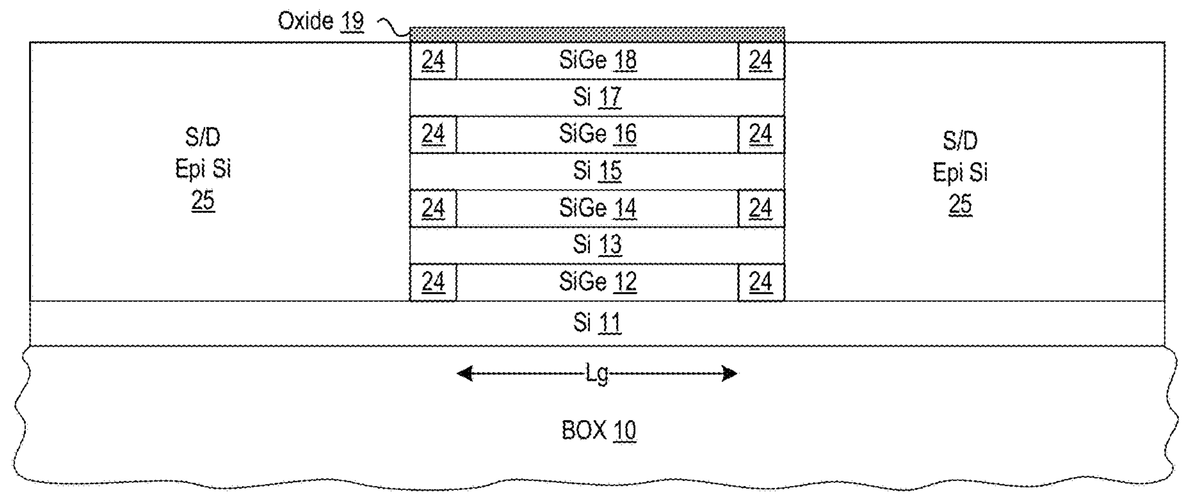
FIG. 5 illustrates processing subsequent to FIG. 4 after epitaxially growing and doping or implanting source/drain regions adjacent to the transistor stack.

FIG. 5 illustrates processing of the semiconductor structure subsequent to FIG. 4 after epitaxially growing and doping or implanting source/drain regions 25 adjacent to the transistor stack. While any suitable source/drain fabrication sequence may be used, the source/drain regions 25 may be formed by using the silicon layer 11 to epitaxially grow or deposit a semiconductor layer (e.g., silicon) in the regions adjacent to the transistor stack. As will be appreciated, the epitaxial silicon deposition or growth process forms the epitaxial source/drain regions 25 from the seed semiconductor layer 11 and any exposed silicon layers 13, 15, 17. At this point, the epitaxial source/drain regions 25 can be doped using any suitable doping technique. For example, the epitaxial source/drain regions 25 may be in-situ doped during the epi process, such as by doping epitaxially grown source/drain features with boron, arsenic and/or phosphorus to form doped epitaxial source/drain regions 25. In some embodiments, the source/drain features are not in-situ doped, and instead an implantation process is performed to dope the epitaxial source/drain regions 25. As will be appreciated, the doping dose used to dope the epitaxial source/drain regions 25 is greater than a doping dose (if any) used to dope the channel regions in the silicon layers 11, 13, 15, 17. In addition, separate processing of the source/drain regions 25 may be performed in separate processing sequences for each of N-type and P-type source/drain features. In some embodiments, after formation of the source/drain regions 25, an epi anneal process may be performed to promote formation of crystalline structures in the epitaxial source/drain regions 25, such as by applying a high thermal budget process. In addition, one or more etch or polish steps may be applied to planarize the top surface of the epitaxial source/drain regions 25.

Figure 6:
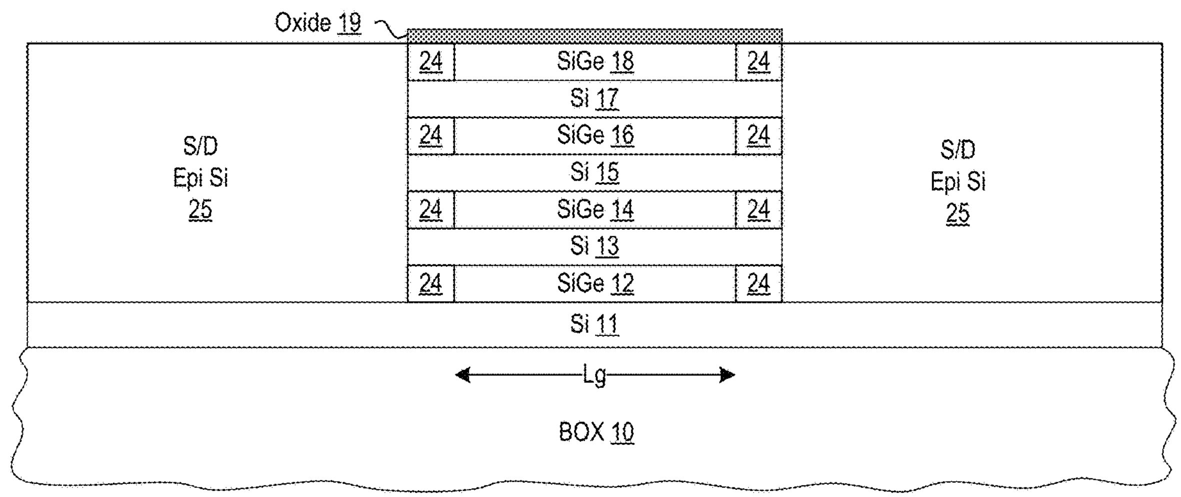
FIG. 6 illustrates processing subsequent to FIG. 5 after the transistor stack is patterned and etched to expose the SiGe layers in the transistor stack.

FIG. 6 illustrates processing of the semiconductor structure subsequent to FIG. 5 after the transistor stack is patterned and etched with an active photo/etch and SiGe access process 26 to expose the SiGe layers in the transistor stack to a subsequent SiGe etch process. While the depicted cross-sectional drawing does not show etch openings that expose the SiGe layers 12, 14, 16, 18, it will be appreciated that the etch openings may be formed in the z-axis plane (in and out of the paper) to expose peripheral ends of the SiGe layers 12, 14, 16, 18. Though not shown, it will be appreciated that the photo/etch and SiGe access process 26 could also be used to form an etch opening which cuts the epitaxial source/drain region 25 into separate portions of epitaxial silicon. While any suitable pattern and etch process may be used, the active photo/etch and SiGe access process 26 may include forming a patterned mask (not shown) over the semiconductor structure by depositing, patterning, etching or developing a photoresist or hard mask layer on the epitaxial source/drain regions 25 and transistor stack. With the openings formed in the patterned photoresist/hard mask, the active photo/etch and SiGe access process 26 may also include one or more etch processes that are applied to create SiGe access openings in at least the transistor stack 12-19 which expose at least the SiGe layers 12, 14, 16, 18. The etch processing can include performing a sequence of reactive-ion etching (RIE) steps having suitable etch chemistry properties to remove, in sequence, the exposed portions of the protective oxide layer 19, and underlying layers of the transistor stack 12-18.

Figure 7:
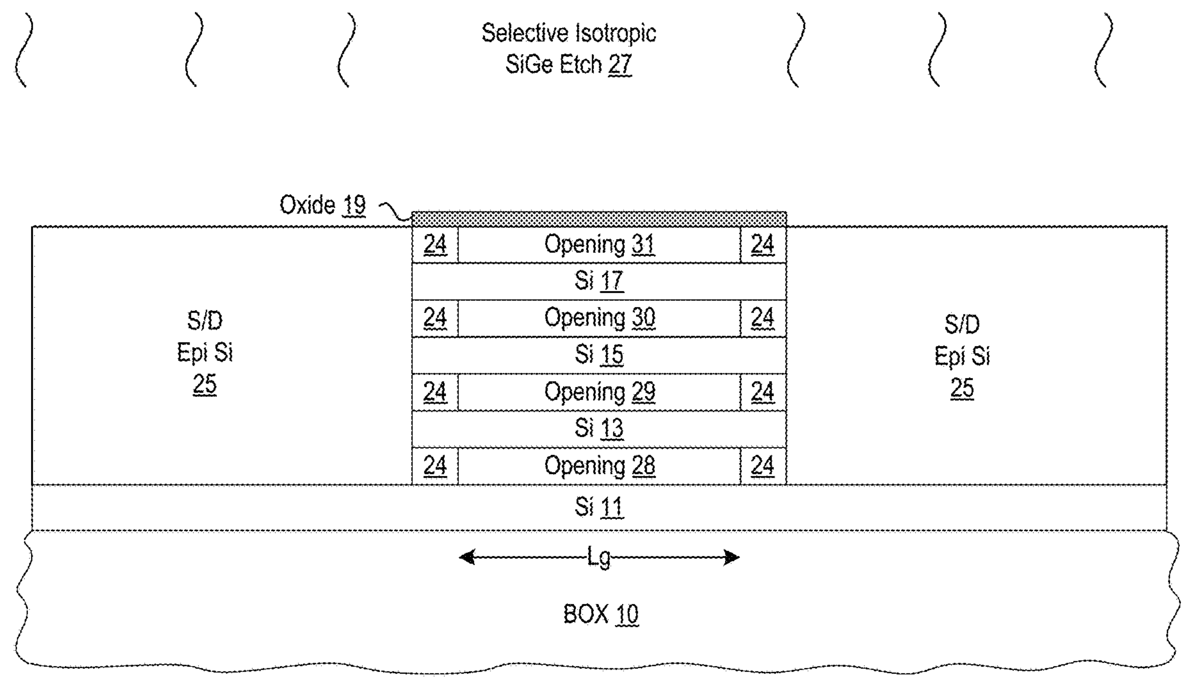
FIG. 7 illustrates processing subsequent to FIG. 6 after selectively etching exposed SiGe layers to form gate openings in the transistor stack.

FIG. 7 illustrates processing of the semiconductor structure subsequent to FIG. 6 after applying a SiGe etch process 27 to selectively etch exposed SiGe layers 12, 14, 16, 18 to form gate openings 28, 29, 30, 31 in the transistor stack. While any suitable SiGe etch process may be used, a selective isotropic SiGe etch process 27, such as a timed isotropic dry etch, may be used to remove the exposed remnant SiGe layers 12, 14, 16, 18 from the transistor stack. At the conclusion of the SiGe etching process 27, the remnant SiGe portions 12, 14, 16, 18 of the transistor stack are replaced by gate openings 28-31 where the gate electrodes for the nanosheet transistors will be formed in the transistor stack.

Figure 8:
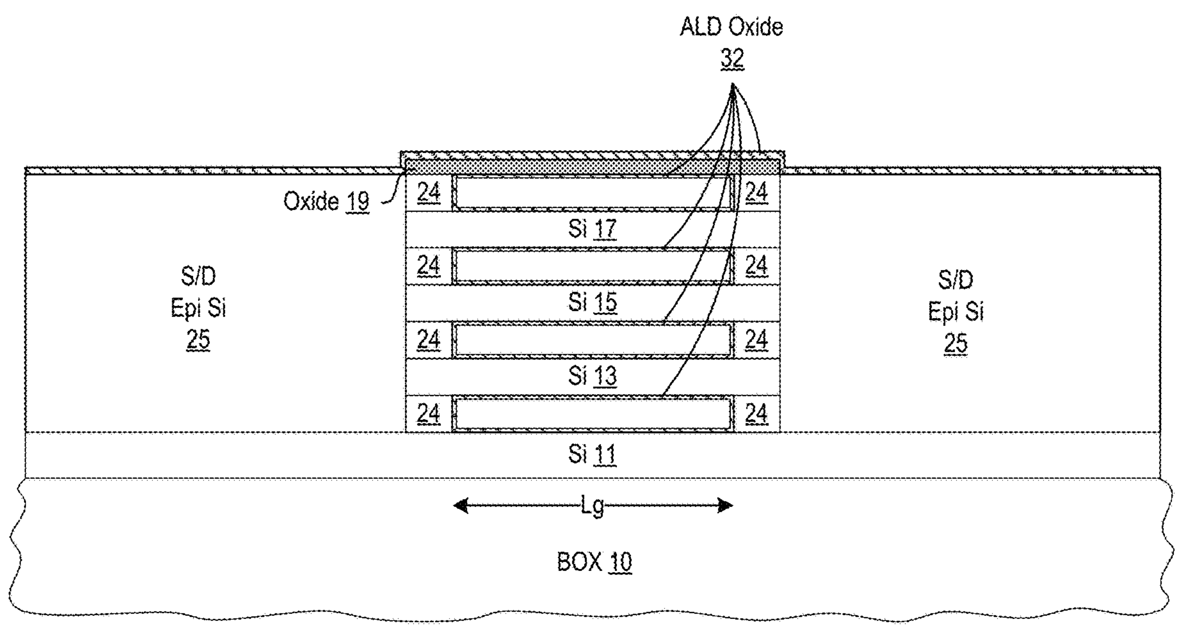
FIG. 8 illustrates processing subsequent to FIG. 7 after an atomic layer deposition (ALD) oxide layer is formed as a liner layer in at least the gate openings of the transistor stack.

FIG. 8 illustrates processing of the semiconductor structure subsequent to FIG. 7 after a conformal gate dielectric layer 32 is formed as a liner layer in at least the gate openings 28-31 of the transistor stack. In selected embodiments, the conformal gate dielectric layer 32 is formed with an atomic layer deposition (ALD) to conformally deposit an ALD oxide layer 32 to a desired gate dielectric thickness (e.g., 5-50 Angstroms) on the interior surfaces of the gate openings 28-31 without completely filling the gate openings. In selected embodiments, the ALD oxide deposition process may by implemented by exposing the semiconductor structure to a precursor, evacuating or purging the precursors as well as byproducts from the chamber, exposing the semiconductor structure to reactant species (e.g., oxidants or other reagents), and evacuating or purging the reactants and byproduct molecules from the chamber. As a result, the ALD oxide deposition process offers accurate control of film thickness and composition as well as the ability to achieve excellent uniformity over large areas at relatively low temperatures. In addition to forming gate dielectric layers in the gate openings 28-31, the resulting ALD oxide 32 forms a substantially conformal layer over the upper surface of the semiconductor structure.

Figure 9:
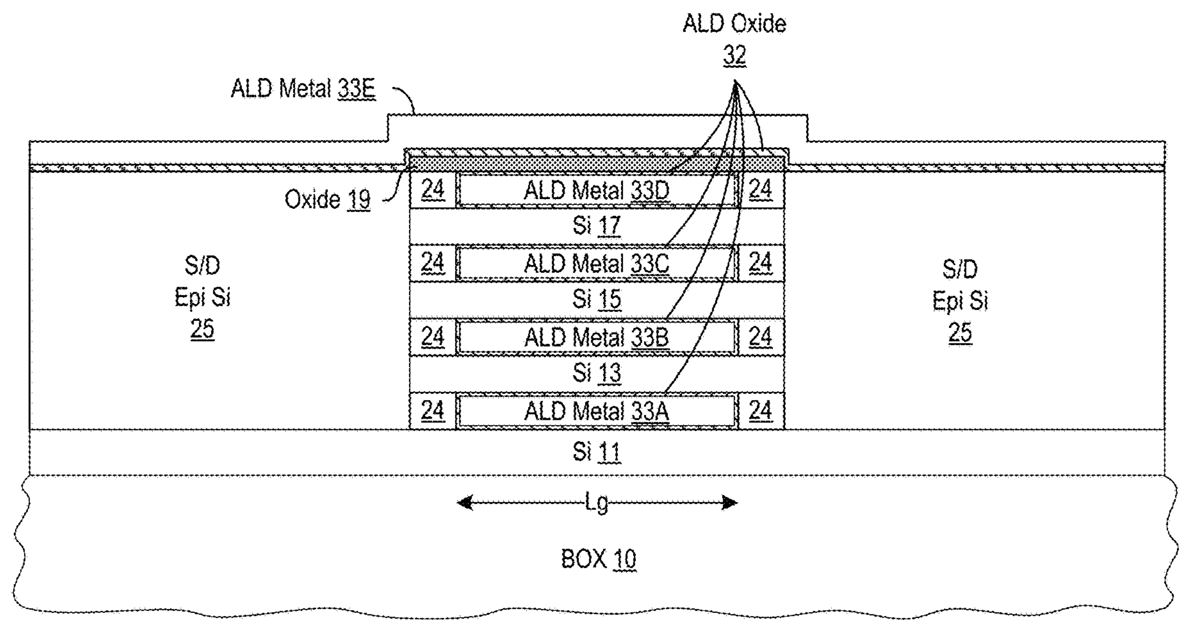
FIG. 9 illustrates processing subsequent to FIG. 8 after an atomic layer deposition (ALD) metal layer is formed as a liner layer to at least fill the gate openings of the transistor stack.

FIG. 9 illustrates processing of the semiconductor structure subsequent to FIG. 8 after an atomic layer deposition (ALD) metal layer 33 is formed as a liner layer to at least fill the remaining gate openings 28-31 of the transistor stack. In selected embodiments, the conductive gate electrode layer(s) 33 are formed with an atomic layer deposition (ALD) process to conformally deposit at least a first ALD metal layer 33A-E on the ALD oxide layers 32 to at least partially fill the remaining gate openings 28-31. In selected embodiments, the ALD metal deposition process may by implemented by exposing the semiconductor structure to a precursor, evacuating or purging the precursors as well as byproducts from the chamber, exposing the semiconductor structure to reactant species (e.g., metals or other reagents), and evacuating or purging the reactants and byproduct molecules from the chamber. In addition to forming gate electrode layers 33A-D in the gate openings 28-31, the ALD metal process forms an ALD metal layer 33E as a substantially conformal layer over the upper surface of the semiconductor structure.

Figure 10:
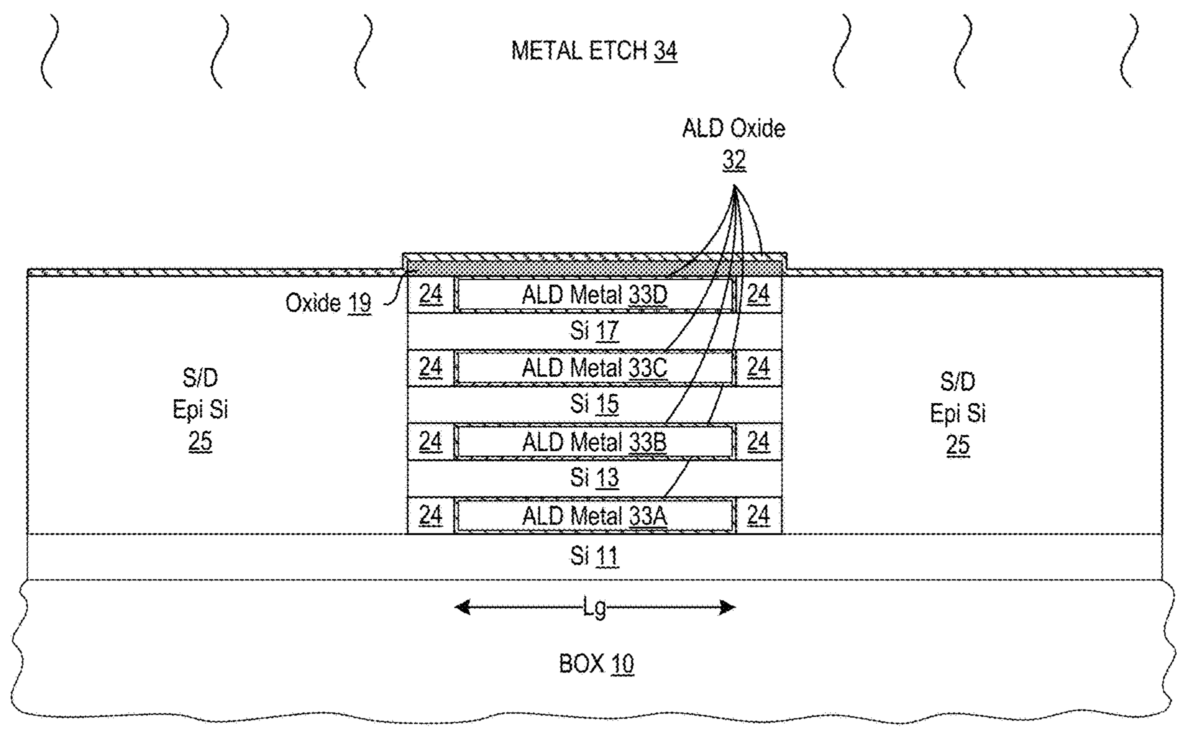
FIG. 10 illustrates processing subsequent to FIG. 9 after removing the ALD metal layer from the upper surface of the transistor stack.

FIG. 10 illustrates processing of the semiconductor structure subsequent to FIG. 9 after applying one or more etch processes to remove the ALD metal layer 33E from the upper surface of the transistor stack. While any suitable etch process may be used, the etch processing can include one or more isotropic etching steps (e.g., RIE) having suitable etch chemistry properties to remove the ALD metal layer 33E from the surface of the semiconductor structure while leaving the underlying ALD oxide layer 32 on the surface of the semiconductor structure.

Figure 11:
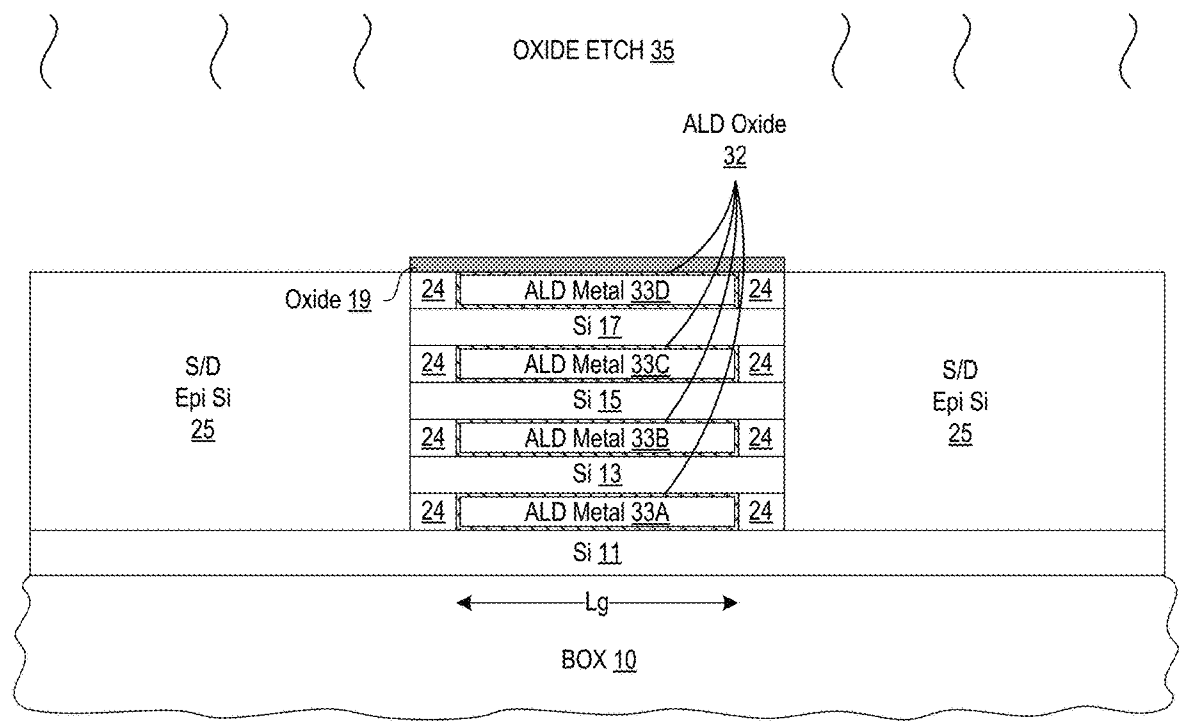
FIG. 11 illustrates processing subsequent to FIG. 10 after removing the ALD oxide layer from the upper surface of the transistor stack.

FIG. 11 illustrates processing of the semiconductor structure subsequent to FIG. 10 after applying one or more etch processes 35 to remove the ALD oxide layer 32 from the upper surface of the transistor stack. While any suitable etch process may be used, the etch processing 35 can include one or more isotropic and/or anisotropic oxide etching steps (e.g., RIE) having suitable etch chemistry properties to remove the ALD oxide layer 32 from the surface of the semiconductor structure while leaving the underlying gate electrodes 33A-D and gate dielectric layers 32 of the transistor stack in place. While the sidewalls of the protective oxide layer 19 are shown as being substantially vertical, minor deviations in the sidewall profile may occur due to etch processing variations.

At the process stage shown in FIG. 11, the fabrication of the nanosheet transistors in the transistor stack is complete except for any silicidation, and the only remaining steps are to process the additional capacitor and/or non-volatile memory device layers as described herein below. As shown, the depicted transistor stack includes a first nanosheet transistor including the first silicon channel region 17 under control of a gate electrode 33C, 33D, a second nanosheet transistor including the second silicon channel region 15 under control of a gate electrode 33C, 33B, a third nanosheet transistor including the third silicon channel region 13 under control of a gate electrode 33B, 33A, and a fourth planar FET transistor including the third silicon channel region 11 under control of the gate electrode 33A. However, the fourth planar FET transistor could be replaced with a fourth nanosheet transistor by patterning and etching the silicon layer 11 to match the patterned silicon layers 13, 15, 17 and including an additional SiGe layer (not shown) below the Si/SiGe superlattice 11-18 which is processed with the same steps applied to the SiGe layers 12, 14, 16, 18 described hereinabove.

Figure 12:
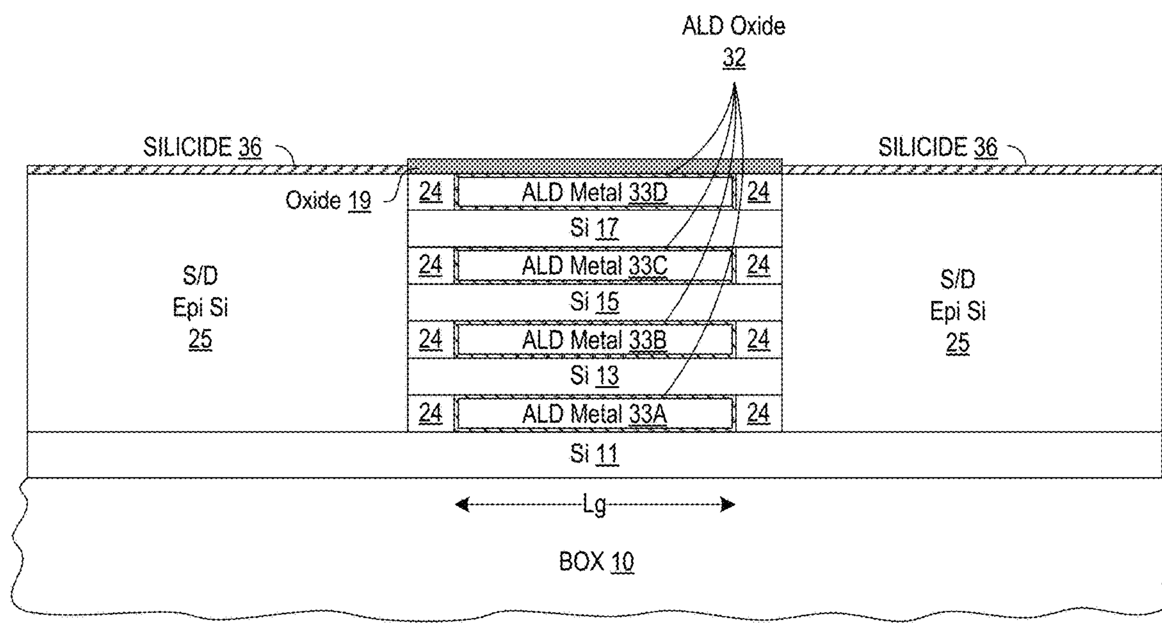
FIG. 12 illustrates processing subsequent to FIG. 11 after selectively forming silicide layers on exposed source/drain regions.

FIG. 12 illustrates processing of the semiconductor structure subsequent to FIG. 11 after selectively forming silicide layers 36 on exposed source/drain regions 25. As formed, the silicide layers 36 facilitate electrical connection to the epitaxial source/drain regions 25. While any desired silicide formation process may be used to form the silicide layers 36 (such as $CoSi_2$ or NiSi), an example silicide formation sequence would be to deposit or sputter a conductive or metal layer (e.g., cobalt or nickel) over the semiconductor structure, followed by a heating step to react the metal layer with the source/drain regions 25 to form silicide layers 36. In an illustrative embodiment, the reaction of the metal layer and the source/drain regions 25 is promoted by performing an initial rapid thermal anneal step (e.g., 400-600° C.), followed by a Piranha clean step to remove excess metal, and then followed by a second rapid thermal anneal step (e.g., 650-850° C.). The timing and temperature of the initial rapid thermal anneal step are selected so that the metal layer reacts with the exposed surfaces of the source/drain regions 25. After the Piranha clean step, the timing and temperature of the second rapid thermal anneal step are selected so that the reacted silicide 36 is pushed into a low resistivity phase. As will be appreciated, the thickness of the silicide layers 36 is controlled to be less than the thickness of the protective oxide layer 19, but the depicted scale of the relative layer thicknesses can vary from the depicted illustration.

Figure 13:
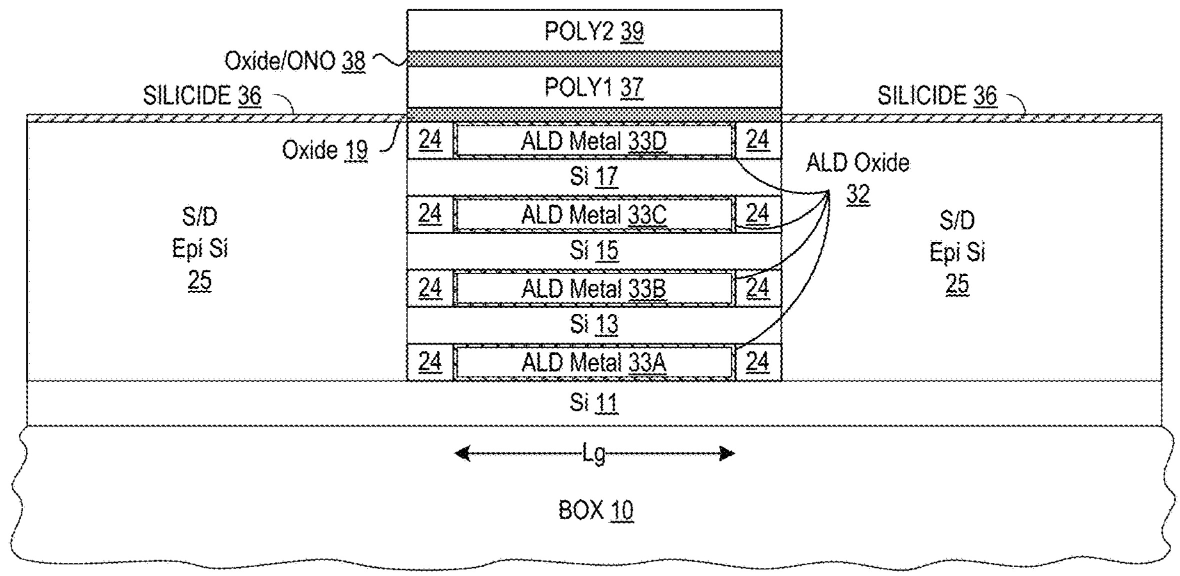
FIG. 13 illustrates processing in accordance with a first embodiment for forming a top storage capacitor or non-volatile memory (NVM) device over the transistor stack by depositing, patterning and etching first and second polysilicon layers separated from one another and the transistor stack by one or more dielectric layers.

In accordance with first selected embodiments of the present disclosure, reference is now made to FIG. 13 which illustrates processing of the semiconductor structure for forming a top storage capacitor or non-volatile memory (NVM) device over the transistor stack by depositing, patterning and etching first and second polysilicon layers 37, 39 separated from one another and the transistor stack by one or more dielectric layers 19, 38. In selected embodiments, the first capacitor plate is formed by depositing, patterning, and etching a first polysilicon layer 37 to form the first capacitor plate over the protective oxide layer 19 and to remove the first polysilicon layer from the areas over the source/drain silicide layers 36. For example, the first polysilicon layer POLY1 may be deposited over the transistor stack using any suitable deposition process (e.g., using CVD, PECVD, PVD, ALD, or any combination(s) of the above) to a predetermined thickness which conformally covers the top surface of the semiconductor structure. The deposited first polysilicon layer 37 may then be selectively etched by forming a patterned photoresist or etch mask and applying a sequence of reactive-ion etching (RIE) steps having suitable etch chemistry properties to remove the first polysilicon layer 37 from the source/drain silicide layers 36 while leaving covered the unetched first polysilicon layer 37 in place as the first capacitor plate on the top of the transistor stack. As formed, the patterned photoresist or etch mask defines not only the first capacitor plate from the first polysilicon layer 37, but also defines landing pads on the first polysilicon layer for making subsequent electrical contact. As will be appreciated, the first polysilicon layer 37 will conformally follow the underlying layers of the semiconductor structure, but is illustrated for purposes of simplicity as a planar POLY1 layer 37.

Subsequently, one or more dielectric layers 38 is formed over semiconductor structure to cover the first capacitor plate, such as by using CVD, PECVD, PVD, ALD, or any combination(s) of the above to form a conformal oxide or oxide-nitride-oxide (ONO) layer to a predetermined thickness that will serve as a capacitor dielectric layer. On the dielectric layer(s) 38, a second capacitor plate is formed by depositing, patterning, and etching a second polysilicon layer 39 to form the second capacitor plate over the dielectric layers 38 and to remove the second polysilicon layer 39 and underlying dielectric layer(s) 38 from the areas over the source/drain silicide layers 36. For example, the second polysilicon layer POLY2 may be deposited over the transistor stack using any suitable deposition process (e.g., using CVD, PECVD, PVD, ALD, or any combination(s) of the above) to a predetermined thickness which conformally covers the top surface of the semiconductor structure. The deposited second polysilicon layer 39 may then be selectively etched by forming a patterned photoresist or etch mask and applying a sequence of reactive-ion etching (RIE) steps having suitable etch chemistry properties to remove the second polysilicon layer 39 and underlying dielectric layer(s) 38 from the source/drain silicide layers 36 while leaving covered the unetched second polysilicon layer 39 in place as the second capacitor plate on the top of the transistor stack. As formed, the patterned photoresist or etch mask defines not only the second capacitor plate from the second polysilicon layer 39, but also defines landing pads on the second polysilicon layer for making subsequent electrical contact. The application of patterned photoresist/etch mask may also selectively remove the second polysilicon layer 39 and underlying dielectric layer(s) 38 over the previously-defined landing pads in the first polysilicon layer 37 for making electrical contact thereto. As will be appreciated, the second polysilicon layer 39 will conformally follow the underlying layers of the semiconductor structure, but is illustrated for purposes of simplicity as a planar POLY2 layer 39.

Figure 14:
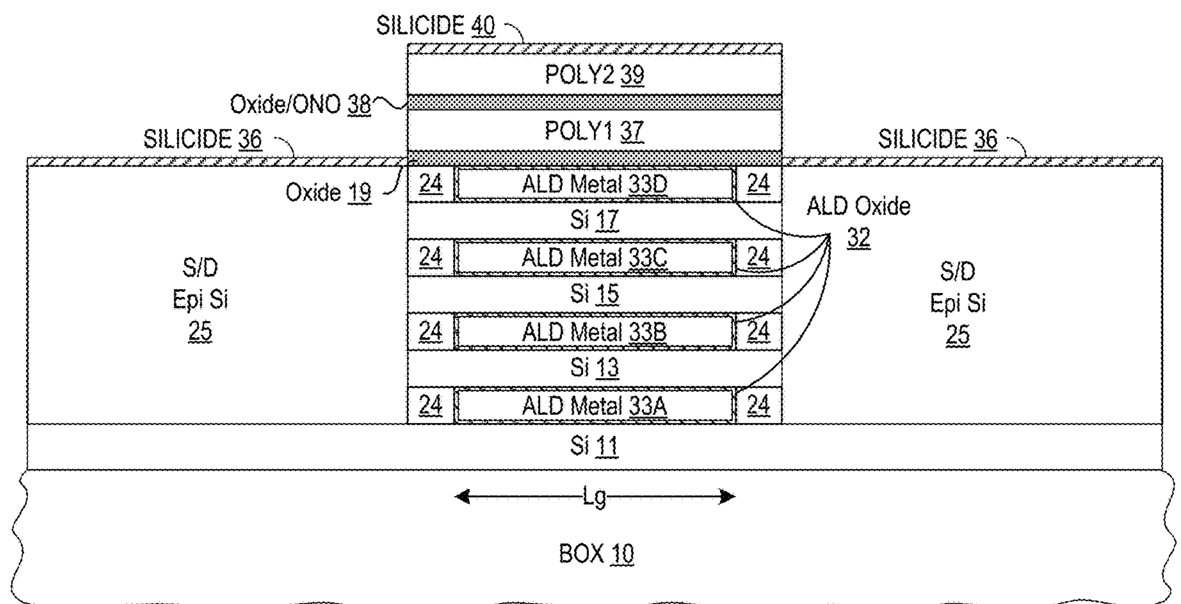
FIG. 14 illustrates processing subsequent to FIG. 13 after selectively forming silicide layers on top of the first and second capacitor plates.

FIG. 14 illustrates processing of the semiconductor structure subsequent to FIG. 13 after selectively forming silicide layer 40 on exposed upper surfaces of the second polysilicon layer 39 to facilitate electrical connection to the second capacitor electrode formed from the second polysilicon layer 39. Though not shown, it will be appreciated that the silicide formation process may also form silicide layers on landing pads in the first polysilicon layer 37. Again, any desired silicide formation process may be used to form the silicide layer 40, such as depositing or sputtering a conductive or metal layer (e.g., cobalt or nickel) over the semiconductor structure and then applying one or more heating or annealing steps to react the metal layer with the second polysilicon layer 39 to form silicide layer 40, (such as $CoSi_2$ or NiSi) before applying a Piranha clean step to remove excess metal. As will be appreciated, the formation of the silicide layer 40 may use silicide metal sputtering onto the wafer that results in minimal sidewall step coverage. If necessary, a short wet etch could be done to clear a thin layer of metal from the sidewalls of the exposed polysilicon layers 37, 39 prior to the silicide heat cycles. As an alternative to using a wet etch to clear the vertical sidewalls of the poly stack 37, 39, the fabrication sequence may form dielectric spacers on the sidewalls of the poly stack 37, 39 before forming the silicide layer 40.

Figure 15:
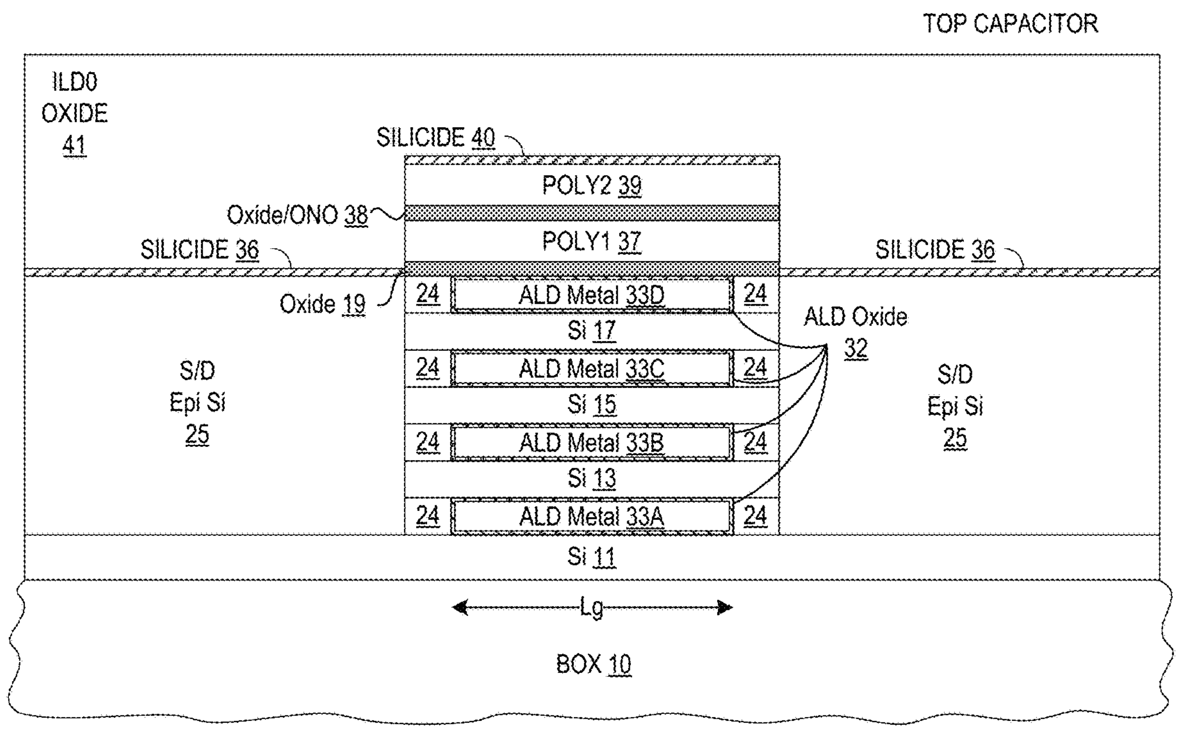
FIG. 15 illustrates processing subsequent to FIG. 14 after forming a planarized first interlayer dielectric layer over the transistor stack.

FIG. 15 illustrates processing of the semiconductor structure subsequent to FIG. 14 after forming a planarized first interlayer dielectric (ILD) layer 41 over the transistor stack and top capacitor electrodes 37, 39. While any suitable deposition process may be used, the first ILD layer 41 may be formed by depositing and planarizing an oxide material over the transistor stack on the semiconductor structure. In selected embodiments, the planarized ILD oxide layer 41 may be formed with a low-temperature oxide (LTO) or spin-on dielectric film. In addition or in the alternative, one or more etch or polish steps may be applied to planarize the top surface of the ILD oxide layer 41, such as by using a chemical mechanical polish (CMP) process.

Figure 16:
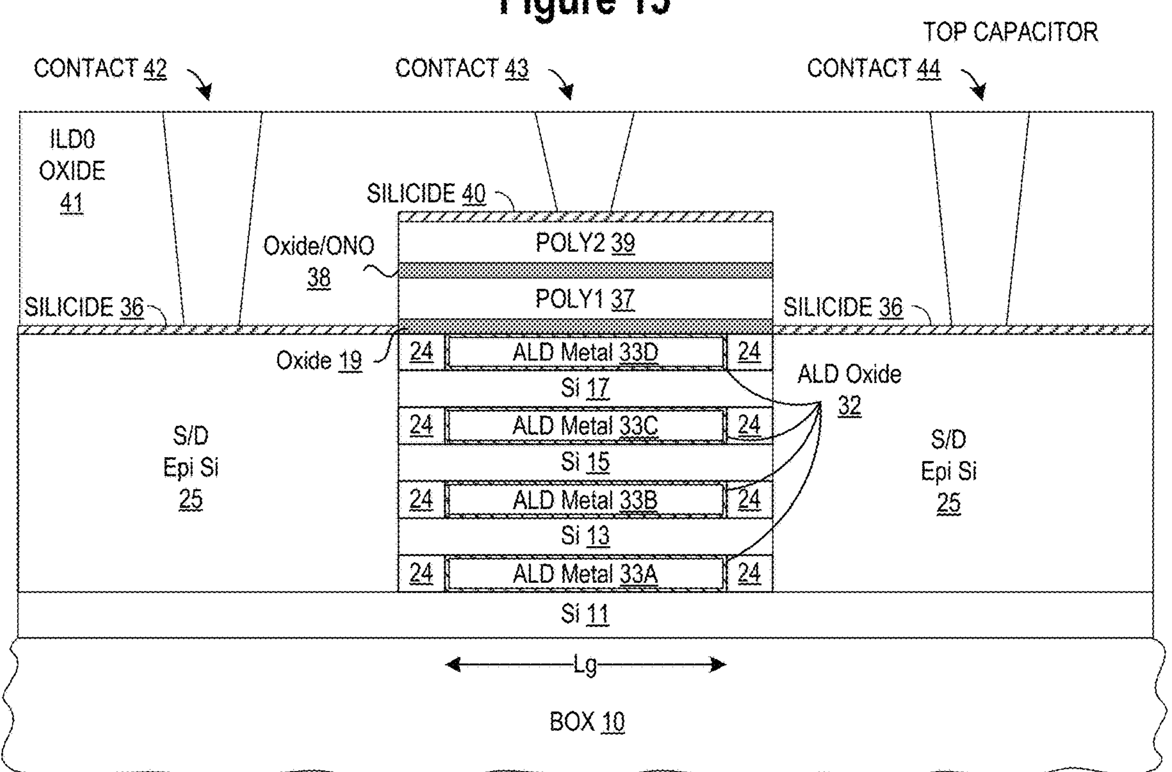
FIG. 16 illustrates processing subsequent to FIG. 15 after selectively etching contact openings through the planarized first interlayer dielectric layer to the source/drain regions and first and second capacitor plates.

FIG. 16 illustrates processing of the semiconductor structure subsequent to FIG. 15 after selectively etching contact openings 42-44 through the planarized first interlayer dielectric layer 41 to the silicided source/drain regions 25 and first and second capacitor plates 37, 39. While any suitable contact etch process may be used, a patterned contact etch mask (not shown) may be formed over the first ILD layer 41 by depositing, patterning, etching or developing a photoresist or hard mask layer on the first ILD layer 41, and then applying one or more etch processes to create the contact openings 42, 43, 44 to the transistor stack. Subsequently, the contact openings 42, 43, 44 may be filled with conductive material to make electrical contact with the underlying silicide layers 36, 40, such as by depositing one or more conductive layers using CVD, PECVD, PVD, ALD, sputtering, or any combination(s) of the above to fill the contact openings 42-44. In addition, a planarization process may be applied to remove excess conductive material, such as by using a chemical mechanical polish (CMP) process. At this point, additional interconnects and conductors are formed with any desired Middle End Of Line (MEOL) and Back End of Line (BEOL) processing steps.

Figure 17:
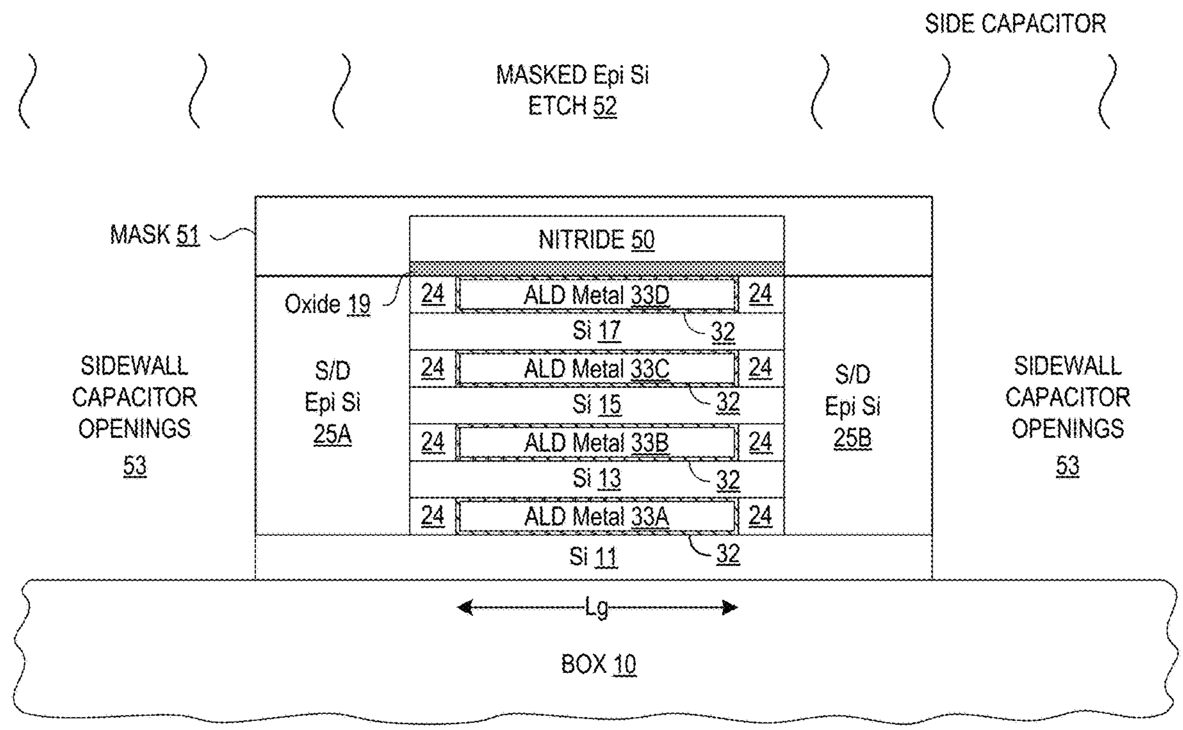
FIG. 17 illustrates processing in accordance with a second embodiment for forming first and second side capacitor plates adjacent to the transistor stack by patterning and etching the source/drain regions of the transistor stack.

In accordance with second selected embodiments of the present disclosure, reference is now made to FIG. 17 which illustrates processing of the semiconductor structure for forming first and second side capacitor plates adjacent to the transistor stack by first using a masked etch process 52 to selectively etch the source/drain regions 25 to form sidewall capacitor openings 53. In the depicted semiconductor structure, the transistor stack includes a protective nitride layer 50 on the underlying oxide layer 19 which may be formed previously in the fabrication process. For example, the protective nitride layer 50 may be fabricated to cover the protective oxide cover layer 19 and Si/SiGe superlattice (FIG. 1) prior to initially etching the transistor stack, or may be fabricated on the protective oxide cover layer 19 after growing the epitaxial source/drain regions 25 (FIG. 11). However formed, the protective nitride layer 50, underlying transistor stack, and source/drain regions 25 may then be patterned and selectively etched to form sidewall capacitor openings 53, leaving etched source/drain regions 25A, 25B. While any suitable masked etch process may be used, an etch mask 51 may be formed by depositing, patterning, etching or developing a photoresist or hard mask layer on the transistor stack with openings formed over the intended sidewall capacitor openings 53, and then applying a masked epitaxial silicon etch process 52 (e.g., RIE) with the etch mask 51 in place to form the sidewall capacitor openings 53 on the sides of the transistor stack by removing exposed parts of the source/drain regions 25 and silicon layer 11 while leaving the transistor stack and remnant or etched source/drain regions 25A, 25B in place.

Figure 18:
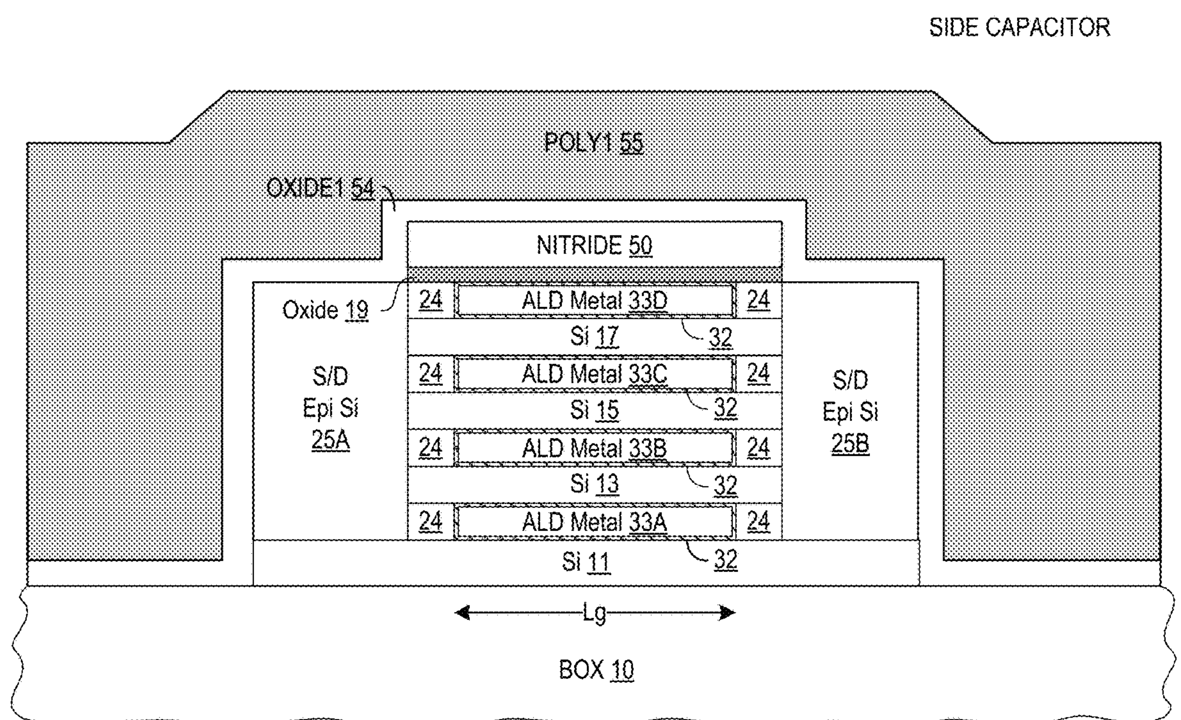
FIG. 18 illustrates processing subsequent to FIG. 17 after sequentially depositing a first dielectric layer and first polysilicon layer over the transistor stack.

FIG. 18 illustrates processing of the semiconductor structure subsequent to FIG. 17 after sequentially depositing a first dielectric layer 54 and first polysilicon layer 55 over the transistor stack. At the depicted processing stage, the etch mask 51 has been removed using any suitable stripping process. As a first step in the sequential deposition processing, one or more first dielectric layers 54 may be formed over semiconductor structure to cover the transistor stack and to conformally cover the sidewall and bottom surfaces of the sidewall capacitor openings 53, such as by using CVD, PECVD, PVD, ALD, or any combination(s) of the above to form a conformal oxide (OXIDE1) layer having a predetermined thickness that will serve as a capacitor dielectric layer. On the first dielectric layer(s) 54, a capacitor plate is formed by depositing the first polysilicon layer 55 to conformally cover the transistor stack and the first dielectric layer 54, thereby filling the remainder of the sidewall capacitor openings 53. For example, the first polysilicon layer POLY1 may be deposited over the transistor stack using any suitable deposition process (e.g., using CVD, PECVD, PVD, ALD, or any combination(s) of the above) to a predetermined thickness which covers the top and sidewall surfaces of the semiconductor structure.

Figure 19:
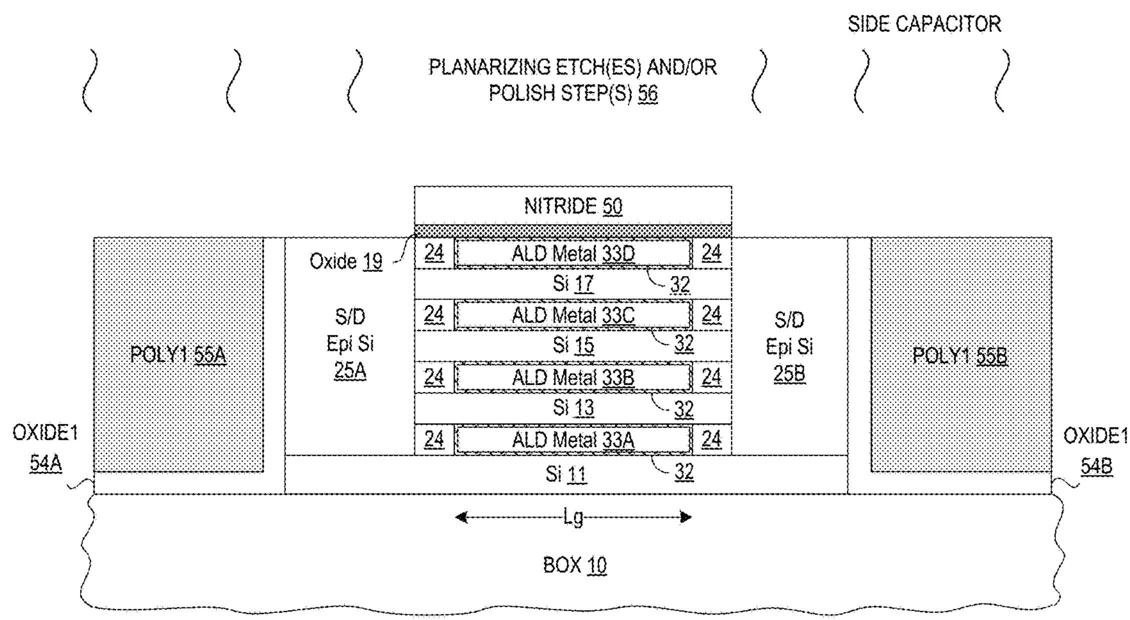
FIG. 19 illustrates processing subsequent to FIG. 18 after performing one or more planarizing etches and/or polish steps to form sidewall capacitor electrodes adjacent to the transistor stack which are capacitively coupled to the source/drain regions through the first dielectric layer.

FIG. 19 illustrates processing of the semiconductor structure subsequent to FIG. 18 after performing one or more planarizing etches and/or polish steps 56 to form sidewall capacitor electrodes 55A, 55B adjacent to the transistor stack which are capacitively coupled to the source/drain regions 25A, 25B through the etched first dielectric layer(s) 54A, 54B. As will be appreciated, the planarizing etch and/or polish steps 56 will be selected based on the materials and shapes of the underlying layers being etched. For example, the planarizing etch and/or polish steps 56 may apply a first isotropic poly etch to the first polysilicon layer 55 that is controlled or timed to etch the top surface of the etched first polysilicon layers 55A, 55B into substantial alignment with the upper surface of the etched source/drain regions 25A, 25B and/or to stop when reaching the first dielectric layer(s) 54 formed on the etched source/drain regions 25A, 25B. In addition, the planarizing etch and/or polish steps 56 may apply a second isotropic oxide etch to the first dielectric layer(s) 54 that is controlled or timed to leave the uppermost surface of the etched first dielectric layer(s) 54A, 54B in substantial alignment with the upper surface of the etched source/drain regions 25A, 25B. In addition or in the alternative, the planarizing etch and/or polish steps 56 may include one or more polish steps that are applied to planarize the top surface of the sidewall capacitor electrodes 55A, 55B and first dielectric layer(s) 54A, 54B, such as by using a chemical mechanical polish (CMP) process that is controlled to stop at the protective nitride layer 50 or even the oxide layer 19 (though would remove the protective nitride layer 50). As a result of depositing and etching or planarizing the first polysilicon layer 55, there are sidewall capacitor electrodes or plates formed on both sides of the transistor stack in the defined sidewall capacitor openings 53, where each sidewall capacitor plate/electrode 55A, 55B is capacitively coupled to the source/drain regions 25A, 25B through the dielectric layer(s) 54A, 54B.

Figure 20:
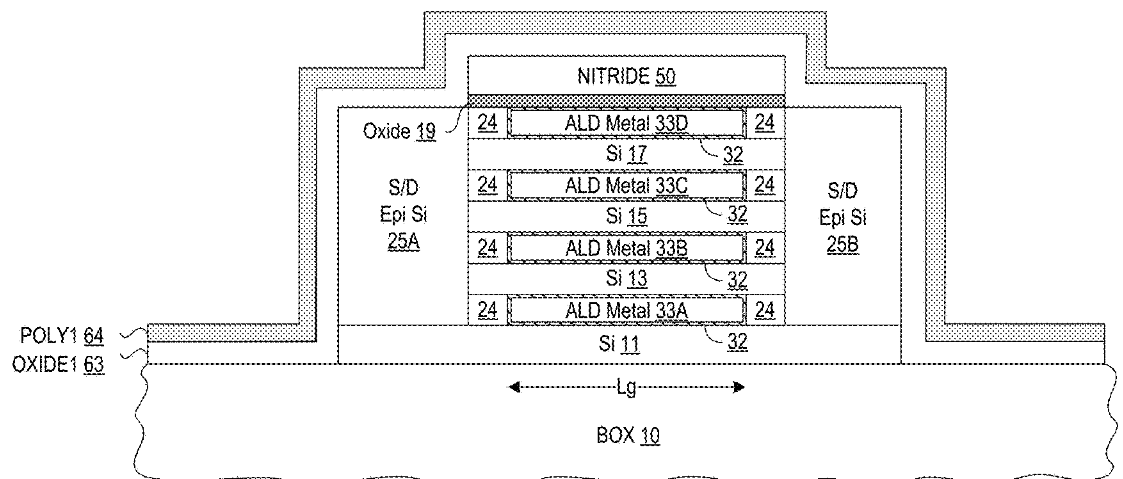
FIG. 20 illustrates processing in accordance with a third embodiment for forming a floating gate non-volatile memory cell adjacent to the transistor stack after sequentially depositing a first dielectric layer and first polysilicon layer over the top and sides of the transistor stack.

In accordance with third selected embodiments of the present disclosure, reference is now made to FIG. 20 which illustrates processing of the semiconductor structure to form floating gate non-volatile memory cells adjacent to the transistor stack in the sidewall capacitor openings 53. In embodiments where the depicted processing of the semiconductor structure occurs after FIG. 17, the depicted stage of processing at FIG. 18 occurs after the etch mask 51 has been removed using any suitable stripping process. As a first step in forming the floating gate non-volatile memory cells, a first dielectric layer 63 and first polysilicon layer 64 are sequentially deposited over the top and sides of the transistor stack and source/drain regions 25A, 25B. For example, one or more first dielectric layers 63 may be formed over semiconductor structure to cover the transistor stack and to conformally cover the sidewall and bottom surfaces of the sidewall capacitor openings 53, such as by using CVD, PECVD, PVD, ALD, or any combination(s) of the above to form a conformal oxide (OXIDE1) layer 63 having a predetermined thickness. On the first dielectric layer(s) 63, a first polysilicon layer 64 is deposited to conformally cover the transistor stack and the first dielectric layer 63 to a predetermined thickness that does not fill the remainder of the sidewall capacitor openings 53. For example, the first polysilicon layer POLY1 64 may be deposited over the transistor stack using any suitable deposition process (e.g., using CVD, PECVD, PVD, ALD, or any combination(s) of the above) to a predetermined thickness which covers the top and sidewall surfaces of the semiconductor structure.

Figure 21:
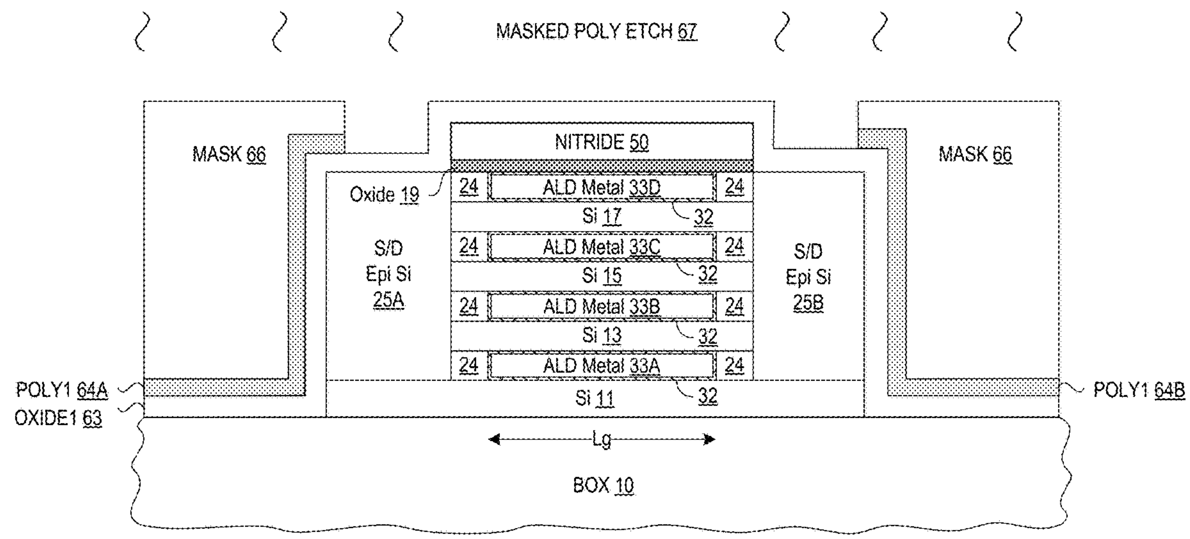
FIG. 21 illustrates processing subsequent to FIG. 20 after a masked poly etch process is applied to the transistor stack to remove the first polysilicon layer from the top of the transistor stack and to form floating gate electrodes from a remnant first polysilicon layer on at least the sides of the transistor stack.

FIG. 21 illustrates processing of the semiconductor structure subsequent to FIG. 20 after a masked poly etch process 67 is applied to the transistor stack to remove exposed portions of the first polysilicon layer 64 from the top of the transistor stack and to form floating gate electrodes from remnant first polysilicon layers 64A, 64B as depicted. While any suitable masked poly etch process 67 may be applied, the deposited first polysilicon layer 64 may then be selectively etched by forming a patterned photoresist or etch mask 66 with an opening over the top of the transistor stack, and then applying a reactive-ion etch (RIE) step having suitable etch chemistry properties which stops at the underlying first dielectric layer 63 to remove exposed portions of the first polysilicon layer 64 from the top of the transistor stack while leaving covered the unetched first polysilicon layers 64A, 64B in place on at least the first dielectric layer 63. As formed, the patterned photoresist or etch mask 66 defines not only the floating gate electrodes from the unetched first polysilicon layer 64A, 64B, but also defines landing pads (not shown) on the first polysilicon layer 64A, 64B for making subsequent electrical contact.

Figure 22:
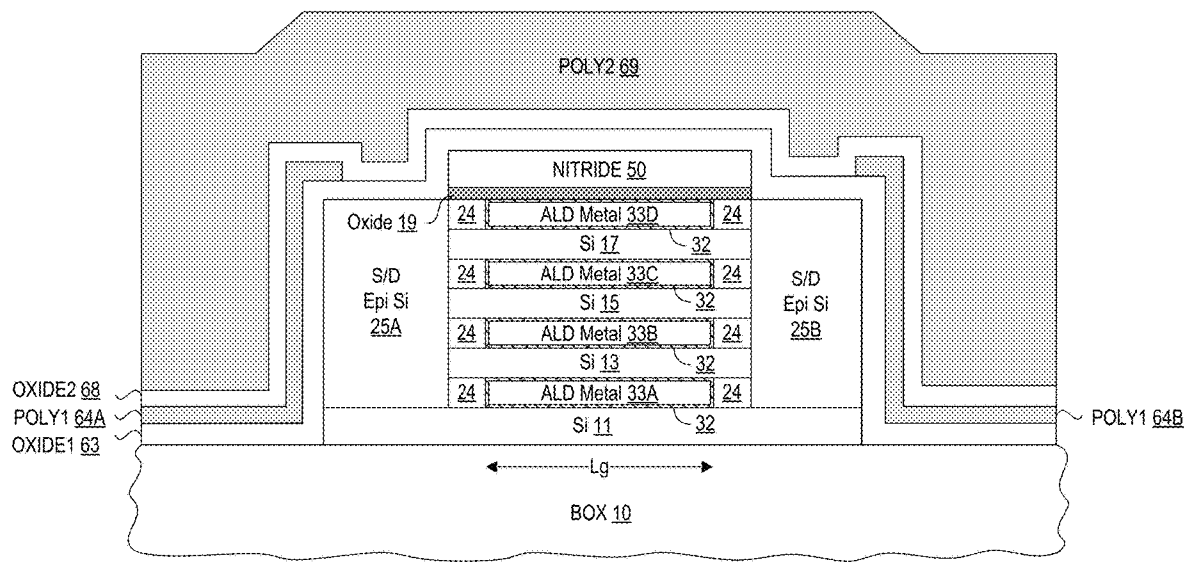
FIG. 22 illustrates processing subsequent to FIG. 21 after sequentially depositing a second dielectric layer and second polysilicon layer over the transistor stack.

FIG. 22 illustrates processing of the semiconductor structure subsequent to FIG. 21 after sequentially depositing a second dielectric layer 68 and second polysilicon layer 69 over the transistor stack. At the depicted processing stage, the etch mask 66 has been removed using any suitable stripping process. As a first step in the sequential deposition processing, one or more second dielectric layers 68 may be formed over semiconductor structure to conformally cover the semiconductor structure, including the transistor stack and the exposed top, sidewall and bottom surfaces of the remnant first polysilicon layers 64A, 64B and the first dielectric layer 63. For example, the second dielectric layer(s) 68 may be deposited by using CVD, PECVD, PVD, ALD, or any combination(s) of the above to form a conformal oxide (OXIDE2) layer having a predetermined thickness. On the second dielectric layer(s) 68, a second polysilicon layer 69 is deposited to cover the transistor stack and the second dielectric layer(s) 68, thereby filling the remainder of the sidewall capacitor openings 53. For example, the second polysilicon layer POLY2 may be deposited over the transistor stack using any suitable deposition process (e.g., using CVD, PECVD, PVD, ALD, or any combination(s) of the above) to a predetermined thickness which covers the top and sidewall surfaces of the semiconductor structure.

Figure 23:
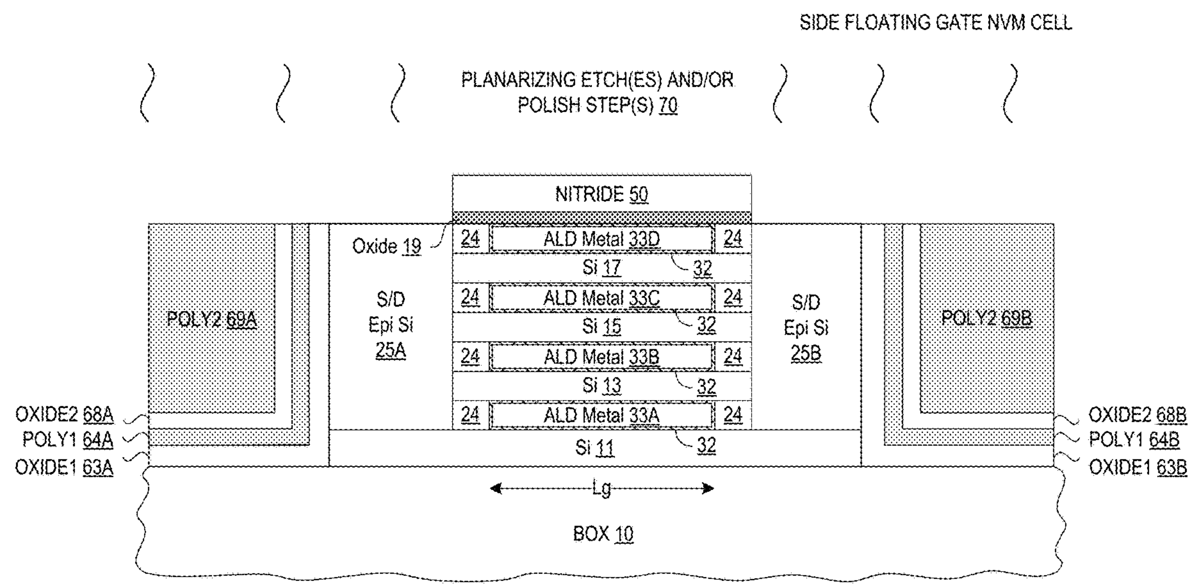
FIG. 23 illustrates processing subsequent to FIG. 22 after performing one or more planarizing etches and/or polish steps to form non-volatile memory cell electrodes on the sides of the transistor stack which are capacitively coupled to the floating gate electrodes through the second dielectric layer.

FIG. 23 illustrates processing of the semiconductor structure subsequent to FIG. 22 after performing one or more planarizing etch and/or polish steps 70 to form NVM cell electrodes 69A, 69B adjacent to the transistor stack which are capacitively coupled to the floating gate electrodes 64A, 64B through the second dielectric layer(s) 68A, 64B. As will be appreciated, the planarizing etch and/or polish steps 70 will be selected based on the materials and shapes of the underlying layers being etched. For example, the planarizing etch and/or polish steps 70 may apply a first isotropic poly etch to the second polysilicon layer 69 that is controlled or timed to etch the top surface of the etched second polysilicon layer 69A, 69B into substantial alignment with the upper surface of the etched source/drain regions 25A, 25B and/or to stop when reaching the second dielectric layer(s) 68. In addition, the planarizing etch and/or polish steps 70 may apply a second isotropic oxide etch to the second dielectric layer(s) 68 that is controlled or timed to leave the uppermost surface of the etched second dielectric layer(s) 68A, 68B in substantial alignment with the upper surface of the etched source/drain regions 25A, 25B. In addition or in the alternative, the planarizing etch and/or polish steps 70 may include one or more polish steps that are applied to planarize the top surface of the NVM cell electrodes 69A, 69B and second dielectric layer(s) 68A, 68B such as by using a chemical mechanical polish (CMP) process that is controlled to stop at the protective nitride layer 50 or even the oxide layer 19 (though would remove the protective nitride layer 50).

Figure 24:
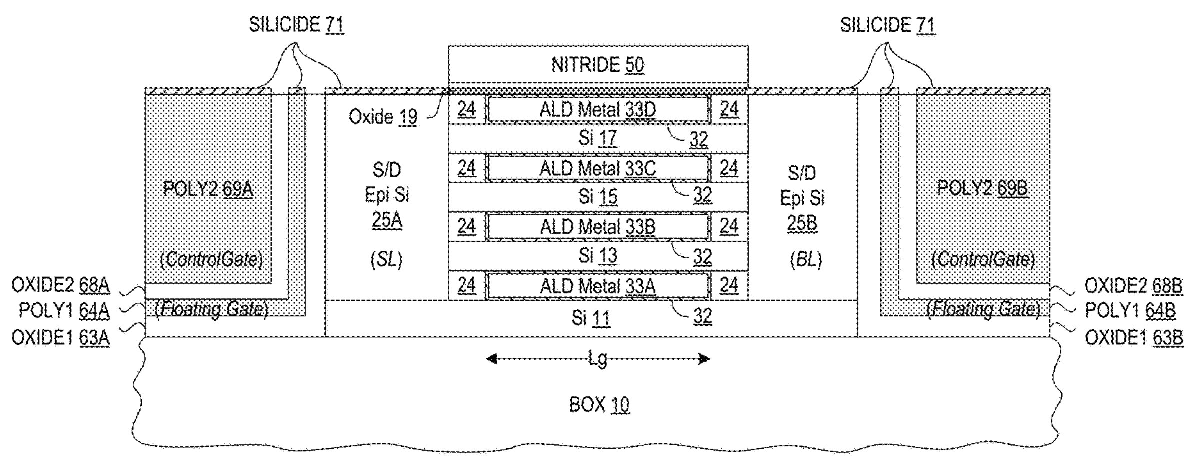
FIG. 24 illustrates processing subsequent to FIG. 23 after selectively forming silicide layers on exposed first and second polysilicon layers and the source/drain regions.

FIG. 24 illustrates processing of the semiconductor structure subsequent to FIG. 23 after selectively forming silicide layers 71 on exposed first and second polysilicon layers 64A/B, 69A/B and the source/drain regions 25A/B to facilitate electrical connection thereto. Though not shown, it will be appreciated that the silicide formation process may also form silicide layers on landing pads in the first and second polysilicon layers 64A/B, 69A/B. Again, any desired silicide formation process may be used to form the silicide layers 71, such as depositing or sputtering a conductive or metal layer (e.g., cobalt or nickel) over the semiconductor structure and then applying one or more heating or annealing steps to react the metal layer with the first and second polysilicon layers 64A/B, 69A/B and the source/drain regions 25A/B to form silicide layers 71, (such as $CoSi_2$ or NiSi) before applying a Piranha clean step to remove excess metal.

As a result of forming the silicided first polysilicon layers 64A, 64B, second polysilicon layers 69A, 69B, and second dielectric layer(s) 68A, 68B over the first dielectric layer(s) 63A, 63B as shown, there are effectively two sidewall capacitor electrodes or plates formed on both sides of the transistor stack with capacitively coupled polysilicon layers 64A/69A, 64B/69B. On the left side, the first polysilicon layer 64A may be formed as a tub in which the second dielectric layer(s) 68A and second polysilicon layer 69A are concentrically positioned, thereby forming a first capacitor which includes a first capacitor plate 64A, capacitor dielectric layer 68A, and second capacitor plate 69A. In addition, first polysilicon layer 64A, first dielectric layer(s) 63A, and source/drain region 25A form a second capacitor which includes the first capacitor plate 64A, capacitor dielectric layer 63A, and third capacitor plate source/drain region 25A. A similar configuration is formed on the right side where the first polysilicon layer 64B is formed as a tub in which the second dielectric layer(s) 68B and second polysilicon layer 69B are concentrically positioned to form a first capacitor which includes a first capacitor plate 64B, capacitor dielectric layer 68B, and second capacitor plate 69B. In similar fashion, the first polysilicon layer 64B, first dielectric layer(s) 63B, and source/drain region 25B form a second capacitor which includes the first capacitor plate 64B, capacitor dielectric layer 63B, and third capacitor plate source/drain region 25B.

As a result of the processing steps illustrated in FIGS. 1-24, there is provided a nanosheet transistor stack formed with top or side capacitor plate electrodes and/or non-volatile memory devices formed on a single die with a single nanosheet process flow, thereby providing a straightforward method for integrating capacitor and/or non-volatile memory devices with advanced nanosheet transistors on the same die. While specific implementation details are described herein for integrating the fabrication of capacitors and/or NVM devices with the nanosheet transistor process flow to make dual use of fabrication steps, it will be appreciated that additional or fewer processing steps may be used and/or combined. And depending upon the electrical connection of the source/drain regions 25A/B, gate electrodes 33A-D, and polysilicon layers 64A/B, 69A/B, the semiconductor structure may be configured in a number of different circuit configurations. In a first example configuration, one or more sidewall capacitors formed on the left side of the transistor stack may be connected in series to the left source/drain region 25A of the nanosheet transistor. In addition or in the alternative, one or more sidewall capacitors formed on the right side of the transistor stack may be connected in series to the right source/drain region 25B of the nanosheet transistor. In yet another configuration, a non-volatile memory cell may be formed when the first polysilicon layers 64A, 64B are electrically connected (e.g., via metal interconnect) to the gate electrodes 33A-D to form a floating gate of a nonvolatile memory cell having a first source/drain region 25A connected to a source line (SL) and a second source/drain region 25B connected to a bit line (BL). In this non-volatile memory cell configuration, the floating gate 64A/B is connected to store electric charges, and the second polysilicon layer 69A/B is connected to a control gate word line.

Figure 25:
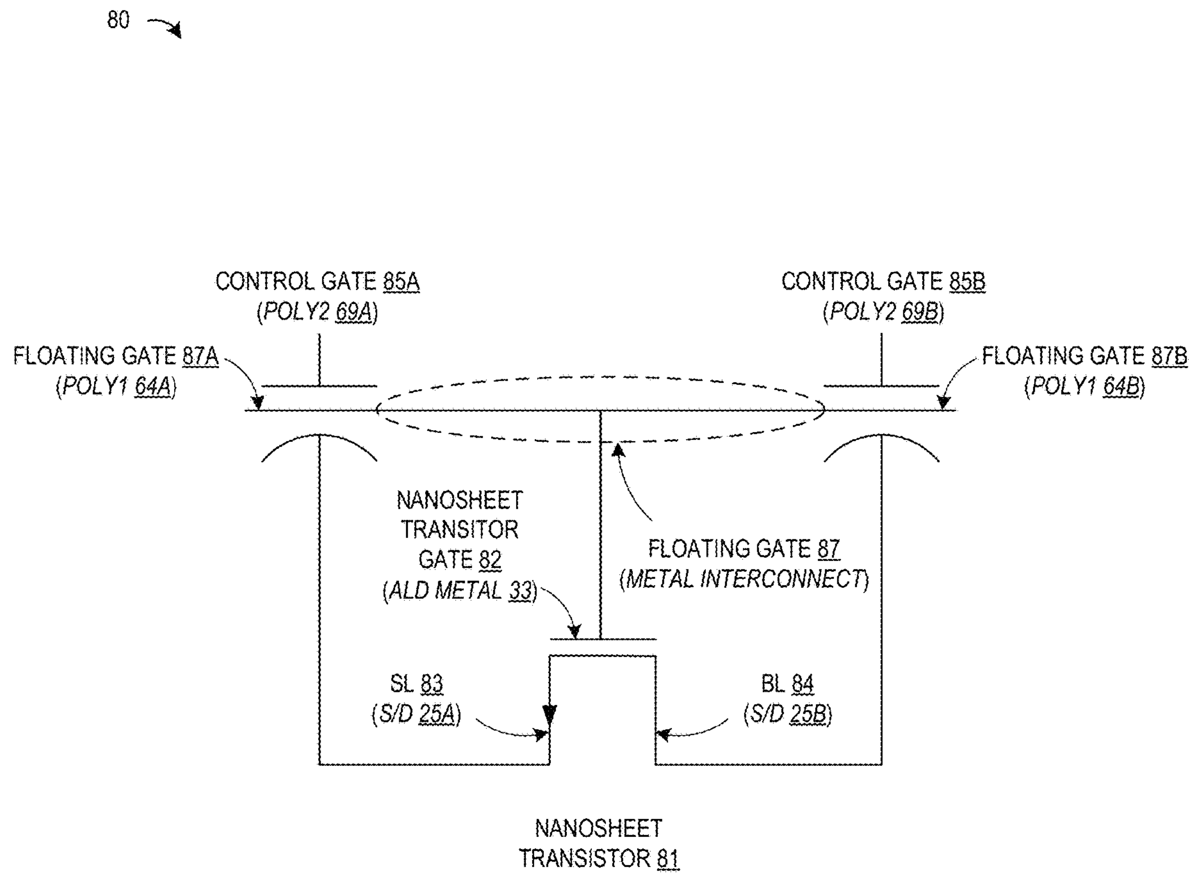
FIG. 25 illustrates a simplified circuit diagram of a non-volatile memory cell formed with a nanosheet transistor having a floating gate terminal in accordance with selected embodiments of the present disclosure.

To illustrate an example implementation of a non-volatile memory cell, reference is now made to FIG. 25 which depicts a simplified circuit diagram of a non-volatile memory (NVM) cell 80 formed with a nanosheet transistor 81 having a gate terminal 82 and source/drain regions connected, respectively to a source line electrode 83 and a bit line electrode 84. By way of example with reference to the semiconductor structure shown in FIG. 24, the nanosheet transistor 81 may be formed with a gate electrode stack 33A-D, dielectric layers 32, and silicon channels 11, 13, 15, 17 connected between the source/drain regions 25A, 25B. Thus, the gate terminal 82 is formed with ALD metal gate electrodes 33A-33D and electrically connected (via metal interconnects) to the floating gate 87 which is formed with the first polysilicon layers 64A/B. In addition, the nanosheet transistor 81 includes a first source/drain region 25A that is connected to a source line electrode 83, and a second source/drain region 25B that is connected to a bit line electrode 84. With the floating gate 87B capacitively sandwiched between a control gate terminal 85B (formed from the second polysilicon layer 69B) and a bit line electrode 84 (formed from source/drain region 25B), the NVM cell 80 may be configured or programmed to write a "1" or "0" from the bit line electrode 84 under control of the control gate terminal 85B, thereby storing charge on the floating gate terminal 87. Thus programmed, the NVM cell 80 may be configured to read the stored "1" or "0" value at the bit line electrode 84 under control of the source line terminal 83.

As will be appreciated, the disclosed nanosheet transistor may be connected in other NVM cell arrangements. For example, the circuit schematic of FIG. 25 shows an NVM cell arrangement where both sides of the nanosheet transistor are connected to provide the floating gate and control gate terminals in a circuit configuration where each nanosheet transistor has a separate source line (SL). However, it will be appreciated that two adjacent nanosheet transistors may share a common source line, in which case nanosheet transistor may have the floating gate/control gate terminals on only one side of the nanosheet transistor rather than both sides.

Figure 26:
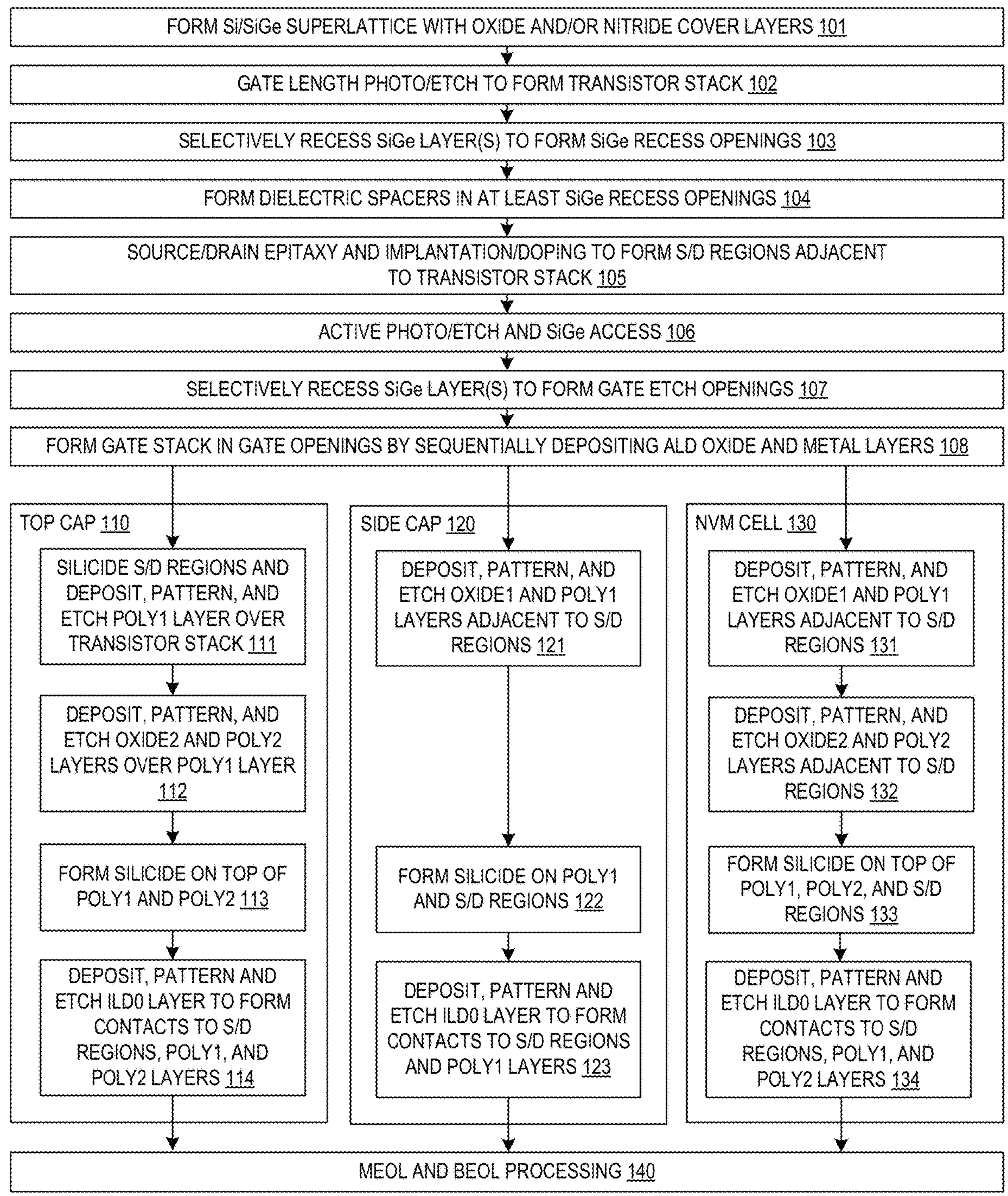
FIG. 26 illustrates a simplified process flow for integrating the fabrication of nanosheet transistors and capacitors and/or NVM devices in accordance with selected embodiments of the present disclosure.

FIG. 26 illustrates a simplified process flow 100 for integrating the fabrication of nanosheet transistors and capacitors and/or NVM devices in accordance with selected embodiments of the present disclosure. The process begins at step 101 with a wafer substrate which is processed to form a silicon/silicon germanium superlattice structure on the wafer substrate. In selected embodiments, the silicon/silicon germanium superlattice structure is formed as a Si/SiGe epi stack by epitaxially growing alternating layers of Si and SiGe on a buried oxide substrate layer, and then covering the Si/SiGe epi stack by depositing an oxide protective layer and/or a protective nitride layer.

At step 102, the Si/SiGe epi stack is processed with a gate length photo/etch process to form a transistor stack. For example, a photoresist layer may be deposited, patterned, etched and developed to form a patterned photoresist or hard mask layer on the protective oxide or nitride layer. With the patterned photoresist/hard mask layer in place, the processing at step 102 may include applying one or more etch processes to create a transistor stack. The etch processing can include a sequence of reactive-ion etching (RIE) steps having suitable etch chemistry properties to sequentially remove exposed portions of the protective oxide or nitride and underlying layers of the Si/SiGe epi stack.

At step 103, the SiGe layers at the exposed sides of the transistor stack are selectively etched or recessed to form SiGe recess openings. For example, a controlled etch process, such as a timed isotropic dry etch, may be applied to selectively recess the SiGe layers exposed at the sides of the transistor stack, thereby forming SiGe recess openings in the transistor stack by partially recessing SiGe layers.

At step 104, dielectric spacers are formed in the SiGe recess openings of the transistor stack. For example, an inner nitride layer may be deposited over the semiconductor structure, and then patterned and isotropically etched to leave the inner nitride layer only in the SiGe recess openings of the transistor stack.

At step 105, doped source/drain epitaxial layers are formed around and adjacent to the transistor stack. In selected embodiments, an epitaxial semiconductor process may be applied to form epitaxial semiconductor layers in the intended source/drain regions which are doped using any suitable doping technique. For example, the epitaxial source/drain regions may be in-situ doped during the epitaxial semiconductor process, such as by doping epitaxially grown source/drain features with boron, arsenic and/or phosphorus to form doped epitaxial source/drain regions. In addition or in the alternative, an implantation process is performed to dope the epitaxial source/drain regions. As will be appreciated, the doping processing may be controlled and applied in separate processing sequences for each of N-type and P-type source/drain features. In addition, the formation of doped epitaxial source/drain regions may include one or more anneal processes to promote formation of crystalline structures in the epitaxial source/drain regions and/or may include one or more etch or polish steps to planarize the top surface of the epitaxial source/drain regions.

At step 106, the transistor stack is processed with an active photo/etch process to access the underlying SiGe layers in the transistor stack. For example, a photoresist layer may be deposited, patterned, etched and developed to form a patterned photoresist or hard mask layer with mask openings positioned over the transistor stack to access the underlying SiGe layers in the transistor stack. With the patterned photoresist/hard mask layer in place, the photo/etch process may include applying one or more etch processes to access the underlying SiGe layers in the transistor stack. The etch processing can include a sequence of reactive-ion etching (RIE) steps having suitable etch chemistry properties to sequentially remove exposed portions of the underlying layers, but without removing the accessed SiGe layers.

At step 107, the SiGe layers at the exposed transistor stack are selectively etched to form gate etch openings by removing the remnant SiGe layers in the transistor stack. For example, a controlled etch process, such as a timed isotropic dry etch, may be applied to selectively etch and remove the SiGe layers exposed at the transistor stack, thereby forming gate etch openings where the remnant SiGe layers were located in the transistor stack.

At step 108, gate electrodes are formed in the gate etch openings of the transistor stack. For example, the gate electrodes may be formed by depositing an ALD oxide layer to form a conformal thin dielectric layer in the gate etch openings of the transistor stack, and then depositing an ALD metal layer to form gate electrodes by filling the gate etch openings. To clear the top surface of the transistor stack and doped source/drain epitaxial layers, one or more etch processes may be applied which have suitable etch chemistry properties to sequentially remove the ALD metal layer and ALD oxide layer formed on the top surface of the semiconductor structure.

At this process stage, the front end of line processing of the nanosheet transistors in the transistor stack is complete except for any silicidation, and any of three different additional processing sequences can be used to fabricate a top storage capacitor or NVM device 110, a sidewall capacitor 120, and/or a sidewall NVM cell 130. While the specific details of the additional processing sequences 110, 120, 130 can each be varied to meet the needs of a particular application, the following description sets forth example embodiments for integrating nanosheet transistors with local capacitors and/or NVM cells in a shared nanosheet process flow.

At step 110, a first processing sequence is performed to fabricate local storage capacitors or NVM devices on the top of the transistor stack by depositing, patterning and etching first and second polysilicon layers separated from one another and the transistor stack by one or more dielectric layers, thereby forming first and second capacitor plates on the top of the transistor stack. The first top cap processing sequence 110 may start with one or more initial processing steps 111 for forming silicide layers on exposed source/drain regions to facilitate electrical connection thereto. The initial processing steps 111 may also include depositing, patterning and etching a first polysilicon layer (POLY1) over the transistor stack and on the protective oxide/nitride cover layer using any suitable processing sequence. The first top cap processing sequence 110 may also include one or more additional processing steps 112 for depositing, patterning and etching a second oxide layer (OXIDE2) and second polysilicon layer (POLY2) over the transistor stack and on the first polysilicon layer (POLY1) using any suitable processing sequence, thereby forming a top capacitor with a bottom plate (etched POLY1) and top plate (etched POLY2). At step 113, silicide layers are formed on exposed top sides of the top capacitor plates (etched POLY1 and POLY2) by using any suitable silicidation process to form silicide on the first polysilicon layer (POLY1) and second polysilicon layer (POLY2). The first top cap processing sequence 110 may also include one or more ILD contact formation steps 114 for depositing, patterning and etching a first interlayer dielectric layer (ILD0) over the top capacitor and transistor stack using any suitable contact etch sequence to etch through the first interlayer dielectric layer (ILD0) to form contacts to the source/drain regions and to the bottom plate (etched POLY1) and top plate (etched POLY2) of the top capacitor.

At step 120, a second processing sequence is performed to fabricate local storage capacitors on the sides of the transistor stack by sequentially depositing a first dielectric layer and first polysilicon layer over the top and sides of the transistor stack, and then performing one or more planarizing etches and/or polish steps to remove the first polysilicon layer from the top of the transistor stack and to form sidewall capacitor electrodes adjacent to the transistor stack which are capacitively coupled to the source/drain regions through the first dielectric layer. The second side cap processing sequence 120 may start with one or more initial processing steps 121 for depositing, patterning and etching a first oxide layer (OXIDE1) and first polysilicon layer (POLY1) over the transistor stack on the protective oxide/nitride cover layer and adjacent to the source/drain regions using any suitable processing sequence. As a result of step 121, a side capacitor is formed on each side of the transistor stack with a first plate (etched POLY1) and second plate (source/drain region). The second side cap processing sequence 120 may also include a silicide formation step 122 to form silicide layers on exposed surfaces of the side capacitor plates (etched POLY1) and source/drain regions by using any suitable silicidation process. The second side cap processing sequence 120 may also include one or more ILD contact formation steps 123 for depositing, patterning and etching a first interlayer dielectric layer (ILD0) over the side capacitor and transistor stack using any suitable contact etch sequence to form contacts through the first interlayer dielectric layer (ILD0) to the first plate (etched POLY1) and second plate (source/drain region) of the side capacitor.

At step 130, a third processing sequence is performed to fabricate NVM cells with the transistor stack by sequentially depositing a first dielectric layer and first polysilicon layer over the top and sides of the transistor stack, selectively etching the first polysilicon layer to form floating gate electrodes on the sides of the transistor stack, sequentially depositing a second dielectric layer and second polysilicon layer over the top and sides of the transistor stack, and then planarizing and/or polishing the second polysilicon layer to form sidewall capacitor electrodes adjacent to the transistor stack which are capacitively coupled to the floating gate electrodes. The third NVM cell processing sequence 130 may start with one or more initial processing steps 131 for depositing, patterning and etching a first oxide layer (OXIDE1) and first polysilicon layer (POLY1) over the transistor stack on the protective oxide/nitride cover layer and adjacent to the source/drain regions using any suitable processing sequence, thereby forming a floating gate electrode from the etched first polysilicon layer (etched POLY1) on each side of the transistor stack. The third NVM cell processing sequence 130 may also include one or more additional processing steps 132 for depositing, patterning and etching a second oxide layer (OXIDE2) and second polysilicon layer (POLY2) over the transistor stack and adjacent to the source/drain regions using any suitable processing sequence, thereby forming an NVM cell with a nanosheet transistor having a floating gate electrode (etched POLY1) along with a control gate terminal formed from the second polysilicon layer (etched POLY2). At step 133, silicide layers are formed on exposed top sides of the source/drain regions, floating gate electrode (etched POLY1), and control gate terminal (etched POLY2) by using any suitable silicidation process. The third NVM processing sequence 130 may also include one or more ILD contact formation steps 134 for depositing, patterning and etching a first interlayer dielectric layer (ILD0) over the transistor stack and NVM cell using any suitable contact etch sequence to etch through the first interlayer dielectric layer (ILD0) to form contacts to the source/drain regions and to the floating gate electrode (etched POLY1) and the control gate terminal (etched POLY2) of the NVM cell.

It will be appreciated that additional processing steps will be used to complete the fabrication of the nanosheet transistors and capacitors/NVM cells into functioning devices. As examples, one or more sacrificial oxide formation, stripping, isolation region formation, extension implant, halo implant, spacer formation, source/drain implant, heat drive or anneal steps, and polishing steps may be performed, along with conventional backend processing (not depicted) typically including formation of multiple levels of interconnect that are used to connect the transistors in a desired manner to achieve the desired functionality. Thus, the specific sequence of steps used to complete the fabrication of the gate electrodes may vary, depending on the process and/or design requirements.

By now it should be appreciated that there has been provided a method for forming a semiconductor device having nanosheet transistors integrated with capacitors and/or NVM cells. In the disclosed method, a stack of alternating first and second semiconductor layers is provided on a substrate. The disclosed method also includes selectively etching the stack of alternating first and second semiconductor layers to form a transistor stack on the substrate. In addition, the disclosed method includes processing the transistor stack to form epitaxial semiconductor current terminal regions adjacent to the transistor stack and to form control electrode portions between the first semiconductor layers which form transistor channel regions in the transistor stack to connect the epitaxial semiconductor current terminal regions and to form one or more insulated conductive electrode layers adjacent to the transistor stack or epitaxial semiconductor current terminal regions, thereby forming a capacitor or nonvolatile memory cell. In selected embodiments, the first semiconductor layer includes a silicon nanosheet layer, and the second semiconductor layer includes a silicon germanium nanosheet layer. In other embodiments, the first and second semiconductor layers are formed, respectively, with first and second semiconductor materials having different isotropic etch rates from one another. In selected embodiments, the one or more insulated conductive electrode layers form a capacitor device. In other embodiments, the one or more insulated conductive electrode layers form a nonvolatile memory (NVM) cell.

In another form, there is provided a method for fabricating a semiconductor device which integrates stacked nanosheet transistors with capacitors and/or NVM cells in a single nanosheet process flow. In the disclosed fabrication method, a stack of alternating silicon and silicon germanium layers is provided on a substrate. In selected embodiments, the stack of alternating silicon and silicon germanium layers is provided by epitaxially growing alternating layers of silicon and silicon germanium on the substrate. The disclosed fabrication method also selectively etches the stack of alternating silicon and silicon germanium layers to form a nanosheet transistor stack on the substrate. In addition, the disclosed fabrication method selectively processes the nanosheet transistor stack to form dielectric spacer layers on peripheral sides of the nanosheet transistor stack which replace peripheral portions of the silicon germanium layers in the nanosheet transistor stack and leave remnant silicon germanium layers in the nanosheet transistor stack. In selected embodiments, the nanosheet transistor stack is selectively processed by partially recessing silicon germanium layers from peripheral sides of the nanosheet transistor stack to form recess cavities adjacent to remnant silicon germanium layers in the nanosheet transistor stack, and then filling the recess cavities with one or more dielectric layers to form dielectric spacers on peripheral sides of the nanosheet transistor stack. In such embodiments, the recess cavities may be filled by depositing a nitride layer on at least the nanosheet transistor stack using a thin film technology comprising chemical vapor deposition, plasma enhanced chemical vapor deposition, molecular beam epitaxy, sputtering, and/or atomic layer deposition, and then etching the nitride layer to form the nitride spacers on peripheral sides of the remnant silicon germanium layers in the nanosheet transistor stack. In addition, the disclosed fabrication method forms doped epitaxial semiconductor regions adjacent to the nanosheet transistor stack. In addition, the disclosed fabrication method selectively processes the nanosheet transistor stack to form gate electrodes which replace the remnant silicon germanium layers in the nanosheet transistor stack, thereby forming a nanosheet transistor comprising the gate electrodes, the silicon layers from the nanosheet transistor stack, and the doped epitaxial semiconductor regions. In selected embodiments, the formation of gate electrodes includes selectively etching the remnant silicon germanium layers from the nanosheet transistor stack to form gate etch openings in the nanosheet transistor stack; conformally depositing one or more dielectric layers in the gate etch openings using a thin film technology that does not completely fill the gate etch openings; and depositing one or more conductive layers in the gate etch openings to form gate electrodes in the gate etch openings. The disclosed fabrication method also selectively forms one or more insulated conductive electrode layers adjacent to the nanosheet transistor to define a capacitor or nonvolatile memory cell that is integrated with the nanosheet transistor. In selected embodiments, the insulated conductive electrode layers form a top storage capacitor on top of the nanosheet transistor by depositing, patterning and etching first and second polysilicon layers separated from one another and the nanosheet transistor by one or more dielectric layers, thereby forming first and second capacitor plates on the top of the nanosheet transistor which are capacitively coupled to form the top storage capacitor. In other selected embodiments, the insulated conductive electrode layers form a sidewall storage capacitor adjacent to the nanosheet transistor by depositing, patterning and etching a first polysilicon layer separated from the nanosheet transistor by one or more dielectric layers, thereby forming a capacitor plate on the side of the nanosheet transistor that is capacitively coupled to one of the doped epitaxial semiconductor regions to form the sidewall storage capacitor. In still other selected embodiments, the insulated conductive electrode layers form a nonvolatile memory (NVM) cell integrated with the nanosheet transistor by depositing, patterning and etching a first polysilicon layer separated from the nanosheet transistor by one or more first dielectric layers, thereby forming a floating gate electrode on the side of the nanosheet transistor; and depositing, patterning and etching a second polysilicon layer separated from the first polysilicon layer by one or more second dielectric layers, thereby forming first and second NVM cell electrodes on the sides of the nanosheet transistor which are capacitively coupled to the floating gate electrode through the one or more second dielectric layers to form the NVM cell.

In yet another form, there has been provided a method for fabricating a semiconductor device which integrates the nanosheet transistors with capacitors and/or NVM cells. In the disclosed fabrication method, a semiconductor substrate is provided and a superlattice stack structure including alternating silicon and silicon germanium nanosheet layers is formed on the substrate. The disclosed fabrication method also selectively etches the superlattice stack structure to form a patterned nanosheet stack of alternating silicon and silicon germanium nanosheet layers. In addition, the disclosed fabrication method processes the patterned nanosheet stack to form a nanosheet transistor which includes all-around gate electrodes formed around silicon nanosheet layers from the patterned nanosheet stack which connect doped epitaxial source/drain semiconductor regions formed on opposite sides of the patterned nanosheet stack. In selected embodiments, the patterned nanosheet stack is processed to form the nanosheet transistor by selectively processing the patterned nanosheet stack to form dielectric spacer layers on peripheral sides of the patterned nanosheet stack which replace peripheral portions of the silicon germanium layers in the patterned nanosheet stack and leave remnant silicon germanium layers in the patterned nanosheet stack. In addition, the patterned nanosheet stack is processed form doped epitaxial source/drain semiconductor regions adjacent to the patterned nanosheet stack. In addition, the patterned nanosheet stack is selectively processed to form gate electrodes which replace the remnant silicon germanium layers in the patterned nanosheet stack, thereby forming the nanosheet transistor. The disclosed fabrication method also selectively forms one or more insulated conductive electrode layers to define a capacitive element that is integrated with the nanosheet transistor. In selected embodiments, the one or more insulated conductive electrode layers are selectively formed by sequentially forming first and second conductive polysilicon layers separated from one another by a capacitive dielectric layer to define a top storage capacitor on top of the nanosheet transistor that is separated from the nanosheet transistor by a first insulating layer. In such top storage capacitor embodiments, the first and second conductive polysilicon layers may be sequentially processed by depositing, patterning and etching the first conductive polysilicon layer separated from the nanosheet transistor by at least the first insulating layer; forming the capacitive dielectric layer on the first conductive polysilicon layer; and depositing, patterning and etching the second conductive polysilicon layer on the capacitive dielectric layer, thereby forming a first top capacitor plate from the first conductive polysilicon layer and a second top capacitor plate from the second conductive polysilicon layer which are capacitively coupled through the capacitive dielectric layer to form the top storage capacitor. In other embodiments, the one or more insulated conductive electrode layers are selectively formed by forming a first conductive polysilicon layer on a sidewall of the nanosheet transistor that is separated from the nanosheet transistor by a capacitive dielectric layer to define a sidewall storage capacitor. In such sidewall storage capacitor embodiments, the one or more insulated conductive electrode layers may be selectively formed by depositing the capacitive dielectric layer on a sidewall of at least one of the doped epitaxial source/drain semiconductor regions; and depositing, patterning and etching the first conductive polysilicon layer on the capacitive dielectric layer, thereby forming a first capacitor plate from the first conductive polysilicon layer and a second capacitor plate from the at least one of the doped epitaxial source/drain semiconductor regions which are capacitively coupled through the capacitive dielectric layer to form the sidewall storage capacitor. In other embodiments, the one or more insulated conductive electrode layers are selectively formed by forming a nonvolatile memory (NVM) cell integrated with the nanosheet transistor. In such NVM cell embodiments, the nonvolatile memory (NVM) cell may be formed by forming a first insulating layer on a sidewall of at least one of the doped epitaxial source/drain semiconductor regions; depositing, patterning and etching a first conductive polysilicon layer on the first insulating layer, thereby forming a floating gate electrode on the side of the nanosheet transistor; forming a second insulating layer on a sidewall of the first conductive polysilicon layer; and depositing, patterning and etching a second conductive polysilicon layer separated from the first conductive polysilicon layer by the second insulating layer, thereby forming a control gate electrode on the side of the nanosheet transistor which is capacitively coupled to the floating gate electrode through the second insulating layer.

In still yet another form, there is provided a semiconductor device and associated method of fabrication. As disclosed, the semiconductor device includes a nanosheet transistor formed on a substrate which includes a nanosheet stack formed between first and second epitaxial current terminal or source/drain semiconductor regions, where the nanosheet stack includes all-around control electrode portions of gates formed around silicon nanosheet layers from the nanosheet stack which connect the first and second epitaxial current terminal semiconductor regions. In selected embodiments, each of the semiconductor layers includes a silicon nanosheet layer. In other embodiments, the all-around control electrode portions includes one or more ALD metal gate layers formed on one or more ALD oxide layers. In other embodiments, the dielectric-conductor stack includes a stack of oxide and poly layers. The semiconductor device also includes a capacitive element integrated with the nanosheet transistor, the capacitive element comprising a dielectric-conductor stack (e.g., a stack of oxide and poly layers) formed adjacent to the nanosheet transistor. In selected embodiments, the capacitive element is embodied as a top capacitor formed on top of the nanosheet transistor with first and second dielectric-conductor stacks which form, respectively, first and second capacitor plates of the top storage capacitor. In other embodiments, the capacitive element is embodied as a sidewall storage capacitor formed adjacent to the nanosheet transistor with a first dielectric-conductor stack which forms a capacitor plate on the side of the nanosheet transistor that is capacitively coupled to one of the doped epitaxial source/drain semiconductor regions to form the sidewall storage capacitor. In other embodiments, the capacitive element is embodied as a nonvolatile memory (NVM) cell formed adjacent to the nanosheet transistor with first and second dielectric-conductor stacks which form, respectively, a floating gate electrode and control gate electrode of the NVM cell.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted nanosheet transistor structures may be formed with different processing steps that can be combined and integrated with capacitor and/or NVM device fabrication steps, and can utilize Si/SiGe superlattice structures having different numbers of SiGe and Si layers. Also, the various silicon-based constituent layers may be formed with different conductive materials than those disclosed. In addition, the epitaxial source and drains may be p-type or n-type, depending on whether forming either p-type or n-type semiconductor devices. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:

providing a stack of alternating first and second semiconductor layers on a substrate;

selectively etching the stack of alternating first and second semiconductor layers to form a transistor stack on the substrate; and processing the transistor stack to form epitaxial semiconductor current terminal regions adjacent to the transistor stack and to form control electrode portions between the first semiconductor layers which form transistor channel regions in the transistor stack to connect epitaxial semiconductor source/drain regions and to form one or more insulated conductive electrode layers adjacent to the transistor stack or epitaxial semiconductor source/drain regions, thereby forming a nonvolatile memory cell formed adjacent to the transistor stack with first and second dielectric-conductor stacks which form, respectively, a floating gate electrode and control gate electrode of the nonvolatile memory cell.

2. The method of claim 1, where the first semiconductor layer comprises a silicon nanosheet layer, and where the second semiconductor layer comprises a silicon germanium nanosheet layer.

3. The method of claim 1, where the first and second semiconductor layers are formed, respectively, with first and second semiconductor materials having different isotropic etch rates from one another.

4. The method of claim 1, where the one or more insulated conductive electrode layers form a capacitor device in the nonvolatile memory cell.

5. A method for forming a semiconductor device comprising:

providing a stack of alternating silicon and silicon germanium layers on a substrate;

selectively etching the stack of alternating silicon and silicon germanium layers to form a nanosheet transistor stack on the substrate;

selectively processing the nanosheet transistor stack to form dielectric spacer layers on peripheral sides of the nanosheet transistor stack which replace peripheral portions of the silicon germanium layers in the nanosheet transistor stack and leave remnant silicon germanium layers in the nanosheet transistor stack;

forming doped epitaxial semiconductor regions adjacent to the nanosheet transistor stack;

selectively processing the nanosheet transistor stack to form gate electrodes which replace the remnant silicon germanium layers in the nanosheet transistor stack, thereby forming a nanosheet transistor comprising the gate electrodes, the silicon layers from the nanosheet transistor stack, and the doped epitaxial semiconductor regions; and forming a top storage capacitor on top of the nanosheet transistor by depositing, patterning and etching first and second polysilicon layers separated from one another and the nanosheet transistor by one or more dielectric layers, thereby forming first and second capacitor plates on the top of the nanosheet transistor which are capacitively coupled to form the top storage capacitor.

6. A method for forming a semiconductor device comprising:

providing a semiconductor substrate;

forming a superlattice stack structure comprising alternating silicon and silicon germanium nanosheet layers on the substrate;

selectively etching the superlattice stack structure to form a patterned nanosheet stack of alternating silicon and silicon germanium nanosheet layers;

processing the patterned nanosheet stack to form a nanosheet transistor comprising all-around gate electrodes formed around silicon nanosheet layers from the patterned nanosheet stack which connect doped epitaxial source/drain semiconductor regions formed on opposite sides of the patterned nanosheet stack; and selectively forming one or more insulated conductive electrode layers to define a capacitive element that is integrated with the nanosheet transistor by sequentially forming first and second conductive polysilicon layers separated from one another by a capacitive dielectric layer to define a top storage capacitor on top of the nanosheet transistor that is separated from the nanosheet transistor by a first insulating layer.

7. The method of claim 6, where processing the patterned nanosheet stack to form the nanosheet transistor comprises:

selectively processing the patterned nanosheet stack to form dielectric spacer layers on peripheral sides of the patterned nanosheet stack which replace peripheral portions of the silicon germanium layers in the patterned nanosheet stack and leave remnant silicon germanium layers in the patterned nanosheet stack;

forming doped epitaxial source/drain semiconductor regions adjacent to the patterned nanosheet stack;

selectively processing the patterned nanosheet stack to form gate electrodes which replace the remnant silicon germanium layers in the patterned nanosheet stack, thereby forming the nanosheet transistor.

8. The method of claim 6, where sequentially forming first and second conductive polysilicon layers comprises:

depositing, patterning and etching the first conductive polysilicon layer separated from the nanosheet transistor by at least the first insulating layer;

forming the capacitive dielectric layer on the first conductive polysilicon layer; and depositing, patterning and etching the second conductive polysilicon layer on the capacitive dielectric layer, thereby forming a first top capacitor plate from the first conductive polysilicon layer and a second top capacitor plate from the second conductive polysilicon layer which are capacitively coupled through the capacitive dielectric layer to form the top storage capacitor.

9. A semiconductor device comprising:

a substrate;

a transistor comprising a stack formed on top of the substrate between first and second epitaxial current terminal semiconductor regions, where a nanosheet stack comprises all-around control electrode portions formed around semiconductor layers from the nanosheet stack which connect the first and second epitaxial current terminal semiconductor regions; and a capacitive element integrated with a nanosheet transistor, the capacitive element comprising a sidewall storage capacitor formed adjacent to the nanosheet transistor with a first dielectric-conductor stack which forms a capacitor plate on the side of the nanosheet transistor that is capacitively coupled to one of the doped epitaxial source/drain semiconductor regions to form the sidewall storage capacitor.

10. The semiconductor of claim 9, where each of the semiconductor layers comprises a silicon nanosheet layer.

11. The semiconductor of claim 9, where the all-around control electrode portions comprise one or more ALD metal gate layers formed on one or more atomic layer deposition (ALD) oxide layers.

12. The semiconductor of claim 9, where the dielectric-conductor stack comprises a stack of oxide and polysilicon layers.

13. The semiconductor of claim 9, where the capacitive element comprises a nonvolatile memory (NVM) cell formed adjacent to the nanosheet transistor with first and second dielectric-conductor stacks which form, respectively, a floating gate electrode and control gate electrode of the NVM cell.

14. A method for forming a semiconductor device comprising:

providing a stack of alternating silicon and silicon germanium layers on a substrate;

selectively etching the stack of alternating silicon and silicon germanium layers to form a nanosheet transistor stack on the substrate;

selectively processing the nanosheet transistor stack to form dielectric spacer layers on peripheral sides of the nanosheet transistor stack which replace peripheral portions of the silicon germanium layers in the nanosheet transistor stack and leave remnant silicon germanium layers in the nanosheet transistor stack;

forming doped epitaxial semiconductor regions adjacent to the nanosheet transistor stack;

selectively processing the nanosheet transistor stack to form gate electrodes which replace the remnant silicon germanium layers in the nanosheet transistor stack, thereby forming a nanosheet transistor comprising the gate electrodes, the silicon layers from the nanosheet transistor stack, and the doped epitaxial semiconductor regions; and forming a sidewall storage capacitor adjacent to the nanosheet transistor by depositing, patterning and etching a first polysilicon layer separated from the nanosheet transistor by one or more dielectric layers, thereby forming a capacitor plate on the side of the nanosheet transistor that is capacitively coupled to one of the doped epitaxial semiconductor regions to form the sidewall storage capacitor.

15. A method for forming a semiconductor device comprising:

providing a stack of alternating silicon and silicon germanium layers on a substrate;

selectively etching the stack of alternating silicon and silicon germanium layers to form a nanosheet transistor stack on the substrate;

selectively processing the nanosheet transistor stack to form dielectric spacer layers on peripheral sides of the nanosheet transistor stack which replace peripheral portions of the silicon germanium layers in the nanosheet transistor stack and leave remnant silicon germanium layers in the nanosheet transistor stack;

forming doped epitaxial semiconductor regions adjacent to the nanosheet transistor stack;

selectively processing the nanosheet transistor stack to form gate electrodes which replace the remnant silicon germanium layers in the nanosheet transistor stack, thereby forming a nanosheet transistor comprising the gate electrodes, the silicon layers from the nanosheet transistor stack, and the doped epitaxial semiconductor regions; and forming a nonvolatile memory (NVM) cell integrated with the nanosheet transistor by:

depositing, patterning and etching a first polysilicon layer separated from the nanosheet transistor by one or more first dielectric layers, thereby forming a floating gate electrode on the side of the nanosheet transistor; and depositing, patterning and etching a second polysilicon layer separated from the first polysilicon layer by one or more second dielectric layers, thereby forming a first NVM cell electrode on the side of the nanosheet transistor which is capacitively coupled to the floating gate electrode through the one or more second dielectric layers to form the NVM cell.

16. A method for forming a semiconductor device comprising:

providing a semiconductor substrate;

forming a superlattice stack structure comprising alternating silicon and silicon germanium nanosheet layers on the substrate;

selectively etching the superlattice stack structure to form a patterned nanosheet stack of alternating silicon and silicon germanium nanosheet layers;

processing the patterned nanosheet stack to form a nanosheet transistor comprising all-around gate electrodes formed around silicon nanosheet layers from the patterned nanosheet stack which connect doped epitaxial source/drain semiconductor regions formed on opposite sides of the patterned nanosheet stack; and selectively forming one or more insulated conductive electrode layers to define a capacitive element that is integrated with the nanosheet transistor by forming a first conductive polysilicon layer on a sidewall of the nanosheet transistor that is separated from the nanosheet transistor by a capacitive dielectric layer to define a sidewall storage capacitor.

17. The method of claim 16, where selectively forming one or more insulated conductive electrode layers comprises:

forming the capacitive dielectric layer on a sidewall of at least one of the doped epitaxial source/drain semiconductor regions; and depositing, patterning and etching the first conductive polysilicon layer on the capacitive dielectric layer, thereby forming a first capacitor plate from the first conductive polysilicon layer and a second capacitor plate from the at least one of the doped epitaxial source/drain semiconductor regions which are capacitively coupled through the capacitive dielectric layer to form the sidewall storage capacitor.

18. A method for forming a semiconductor device comprising:

providing a semiconductor substrate;

forming a superlattice stack structure comprising alternating silicon and silicon germanium nanosheet layers on the substrate;

selectively etching the superlattice stack structure to form a patterned nanosheet stack of alternating silicon and silicon germanium nanosheet layers;

processing the patterned nanosheet stack to form a nanosheet transistor comprising all-around gate electrodes formed around silicon nanosheet layers from the patterned nanosheet stack which connect doped epitaxial source/drain semiconductor regions formed on opposite sides of the patterned nanosheet stack; and selectively forming one or more insulated conductive electrode layers to define a nonvolatile memory (NVM) cell that is integrated with the nanosheet transistor by:

forming a first insulating layer on a sidewall of at least one of the doped epitaxial source/drain semiconductor regions;

depositing, patterning and etching a first conductive polysilicon layer on the first insulating layer, thereby forming a floating gate electrode on the side of the nanosheet transistor;

forming a second insulating layer on a sidewall of the first conductive polysilicon layer; and depositing, patterning and etching a second conductive polysilicon layer separated from the first conductive polysilicon layer by the second insulating layer, thereby forming a control gate electrode on the side of the nanosheet transistor which is capacitively coupled to the floating gate electrode through the second insulating layer.

* * * * *